(12) United States Patent
Huang et al.

(10) Patent No.: US 11,380,580 B2
(45) Date of Patent: Jul. 5, 2022

(54) ETCH STOP LAYER FOR MEMORY DEVICE FORMATION

(71) Applicant: Taiwan Semiconductor Manufacturing Co., Ltd., Hsinchu (TW)

(72) Inventors: Sheng-Huang Huang, Hsinchu (TW); Chung-Chiang Min, Zhubei (TW); Harry-Hak-Lay Chuang, Zhubei (TW); Hung Cho Wang, Taipei (TW); Sheng-Chang Chen, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/007,260

(22) Filed: Aug. 31, 2020

(65) Prior Publication Data

US 2021/0134668 A1    May 6, 2021

Related U.S. Application Data

(60) Provisional application No. 62/927,999, filed on Oct. 30, 2019.

(51) Int. Cl.
| *H01L 21/768* | (2006.01) |
| *G11C 5/06* | (2006.01) |
| *H01L 21/3213* | (2006.01) |
| *G11C 11/16* | (2006.01) |

(52) U.S. Cl.
CPC .......... *H01L 21/76877* (2013.01); *G11C 5/06* (2013.01); *G11C 11/161* (2013.01); *H01L 21/3213* (2013.01); *H01L 21/76802* (2013.01)

(58) Field of Classification Search
CPC .......... H01L 21/76877; H01L 21/3213; H01L 21/76802; H01L 21/76811; H01L 21/76813; H01L 21/76816; H01L 43/12; H01L 27/228; H01L 27/222; H01L 21/76829; H01L 43/08; G11C 5/06; G11C 11/161
See application file for complete search history.

(56) References Cited

U.S. PATENT DOCUMENTS

| 2013/0032775 A1* | 2/2013 | Satoh ...................... H01L 45/06 257/1 |
| 2016/0380183 A1* | 12/2016 | Chuang ................... H01L 43/12 257/421 |
| 2017/0054070 A1 | 2/2017 | Bak et al. |
| 2017/0092847 A1 | 3/2017 | Kim et al. |

(Continued)

*Primary Examiner* — Karen Kusumakar
(74) *Attorney, Agent, or Firm* — Eschweiler & Potashnik, LLC

(57) ABSTRACT

The present disclosure relates to a method of forming an integrated chip. The method includes forming a memory device over a substrate and forming an etch stop layer over the memory device. An inter-level dielectric (ILD) layer is formed over the etch stop layer and laterally surrounding the memory device. One or more patterning process are performed to define a first trench extending from a top of the ILD layer to expose an upper surface of the etch stop layer. A removal process is performed to remove an exposed part of the etch stop layer. A conductive material is formed within the interconnect trench after performing the removal process.

20 Claims, 13 Drawing Sheets

(56) References Cited

U.S. PATENT DOCUMENTS

| | | |
|---|---|---|
| 2017/0222130 A1 | 8/2017 | Annuziata et al. |
| 2018/0040817 A1 | 2/2018 | Chuang et al. |
| 2018/0309053 A1 | 10/2018 | Annunziata et al. |
| 2019/0148637 A1 | 5/2019 | Ando et al. |
| 2019/0157344 A1 | 5/2019 | Wei et al. |
| 2019/0164584 A1* | 5/2019 | Chuang ................ G11C 11/005 |
| 2019/0273117 A1 | 9/2019 | Hung et al. |
| 2020/0373478 A1* | 11/2020 | Wang ...................... G11C 5/06 |
| 2021/0074907 A1* | 3/2021 | Wang ...................... H01L 43/08 |

* cited by examiner

ETCH STOP LAYER FOR MEMORY DEVICE FORMATION

REFERENCE TO RELATED APPLICATION

This Application claims the benefit of U.S. Provisional Application No. 62/927,999, filed on Oct. 30, 2019, the contents of which are hereby incorporated by reference in their entirety.

BACKGROUND

Many modern day electronic devices contain electronic memory configured to store data. Electronic memory may be volatile memory or non-volatile memory. Volatile memory stores data when it is powered, while non-volatile memory is able to store data when power is removed. Magneto-resistive random-access memory (MRAM) is one promising candidate for a next generation non-volatile memory technology. MRAM devices use magnetic tunnel junctions (MTJs) to store data in a manner that allows for high speed data access and low power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
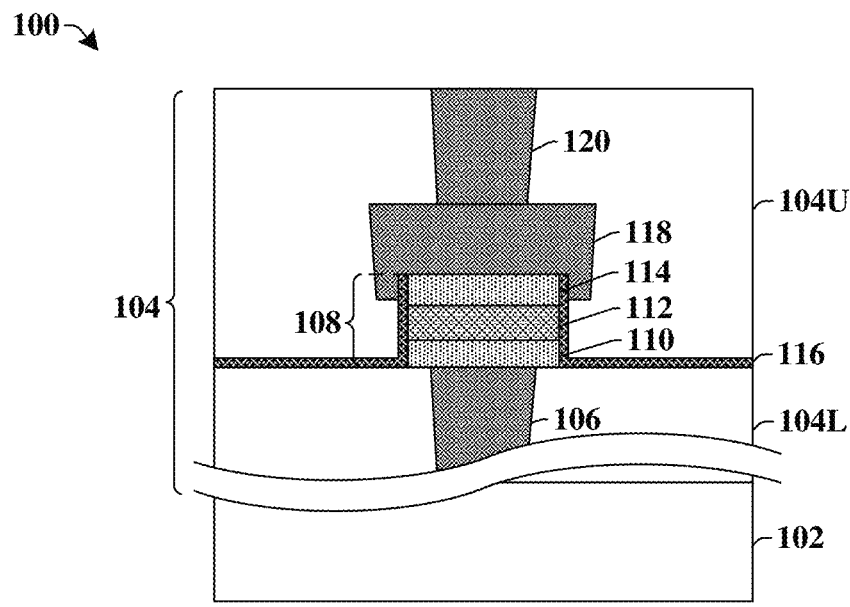
FIG. 1 illustrates a cross-sectional view of some embodiments of an integrated chip having an etch stop layer configured to improve a process window and reduce a cost of forming a memory device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Magnetic tunnel junction (MTJ) devices (e.g., magnetoresistive random-access memory (MRAM) devices) comprise a magnetic tunnel junction (MTJ) vertically arranged within a back-end-of-the-line (BEOL) metal stack between a bottom electrode and a top electrode. The MTJ comprises a pinned layer and a free layer, which are vertically separated by a tunnel barrier layer. A magnetic orientation of the pinned layer is static (i.e., fixed), while a magnetic orientation of the free layer is capable of switching between a parallel configuration and an anti-parallel configuration with respect to that of the pinned layer. The parallel configuration provides for a low resistance state that digitally stores data as a first data state (e.g., a logical "0"). The anti-parallel configuration provides for a high resistance state that digitally stores data as a second data state (e.g., a logical "1").

The top electrode of an MTJ device is typically connected to an overlying interconnect wire by way of a top electrode via. The top electrode via may be formed by etching a via hole into an inter-level dielectric (ILD) layer over the top electrode and subsequently filling the via hole with a conductive material. The via hole may be etched according to a patterned masking layer, such that a size of a top electrode via is generally defined by characteristics of a photolithography system.

As the size of MTJ devices has decreased, it has become increasingly difficult to land a top electrode via onto a top electrode. It has been appreciated that landing an interconnect wire onto the top electrode may be easier and can increase a process window and/or reduce a cost of MTJ device fabrication. To form a good electrical contact between the top electrode and an overlying interconnect wire, the interconnect wire may be formed within a trench that is etched into an ILD layer to extend along opposing sides of the top electrode. However, having the trench extend along opposing sides of the top electrode allows for over-etching of the ILD layer, which can damage an MTJ under the top electrode (e.g., the etch can damage a magnesium oxide layer within an MTJ) and lead to failure of an MTJ device and reduced yield.

The present disclosure, in some embodiments, relates to a method of forming an integrated chip that uses an etch stop layer to prevent damage to an MTJ device during fabrication of the integrated chip. The method comprises forming an MTJ device over a substrate. An etch stop layer is formed over the MTJ device and an upper ILD layer is formed over the etch stop layer. One or more etching processes are subsequently performed on the upper ILD layer to define a trench that exposes a part of the etch stop layer directly over the MTJ device. An additional removal process (e.g., a wet etching process or a wet cleaning process) are then performed to remove the exposed part of the etch stop layer prior to forming a conductive material within the trench. By using separate processes to expose and to remove the etch stop layer, an upper interconnect wire can be formed onto an MTJ device without significantly damaging an MTJ of the MTJ device.

FIG. 1 illustrates a cross-sectional view of some embodiments of an integrated chip 100 having an etch stop layer configured to improve a process window and/or reduce a cost of forming a memory device.

The integrated chip 100 comprises a memory device 108 disposed within a dielectric structure 104 over a substrate 102. The dielectric structure 104 comprises a plurality of stacked inter-level dielectric (ILD) layers. In some embodiments, the plurality of stacked ILD layers may comprise one or more lower ILD layers 104L arranged between the memory device 108 and the substrate 102, and one or more upper ILD layers 104U surrounding the memory device 108. In some embodiments, the one or more lower ILD layers 104L surround a lower interconnect 106 arranged below the memory device 108.

The memory device 108 comprises a bottom electrode 110, a data storage structure 112 arranged over the bottom electrode 110, and a top electrode 114 arranged over the data storage structure 112. In some embodiments, the memory device 108 may comprise a magnetic tunnel junction (MTJ) device. In such embodiments, the data storage structure 112 may comprise a magnetic tunnel junction (MTJ). In some embodiments, the bottom electrode 110 and the top electrode 114 comprise a conductive material, such as copper, aluminum, titanium, tantalum, titanium nitride, tantalum nitride, or the like.

An etch stop layer 116 is disposed over the one or more lower ILD layers 104L and the memory device 108. The one or more upper ILD layers 104U are disposed over the etch stop layer 116. The etch stop layer 116 vertically and laterally separates the memory device 108 from the one or more upper ILD layers 104U. An upper interconnect wire 118 is arranged within the one or more upper ILD layers 104U at a location that is over the memory device 108. The upper interconnect wire 118 laterally extends past opposing sidewalls of the memory device 108 and vertically extends below an uppermost surface of the memory device 108, so that the upper interconnect wire 118 laterally surrounds the memory device 108. In some embodiments, an interconnect via 120 is arranged onto the upper interconnect wire 118 and is set back from one or more sidewalls of the upper interconnect wire 118 by a non-zero distance.

The etch stop layer 116 is configured to mitigate damage to the memory device 108 during one or more etching processes used to form the upper interconnect wire 118 within the one or more upper ILD layers 104U. By mitigating damage to the memory device 108, the upper interconnect wire 118 can be formed to extend past opposing sidewalls of the memory device 108, thereby improving a process window (e.g., overlay errors, critical dimension (CD) errors, etc.) of the memory device 108 and providing for a good electrical connection between the top electrode 114 and the upper interconnect wire 118. Furthermore, having the upper interconnect wire 118 contact the top electrode 114 can also reduce a number of photomasks that are used to form the integrated chip 100 (e.g., by removing photomasks used to form a top electrode via, to perform etch back processes, etc.), thereby reducing a fabrication cost of the integrated chip 100.

Figure 2:
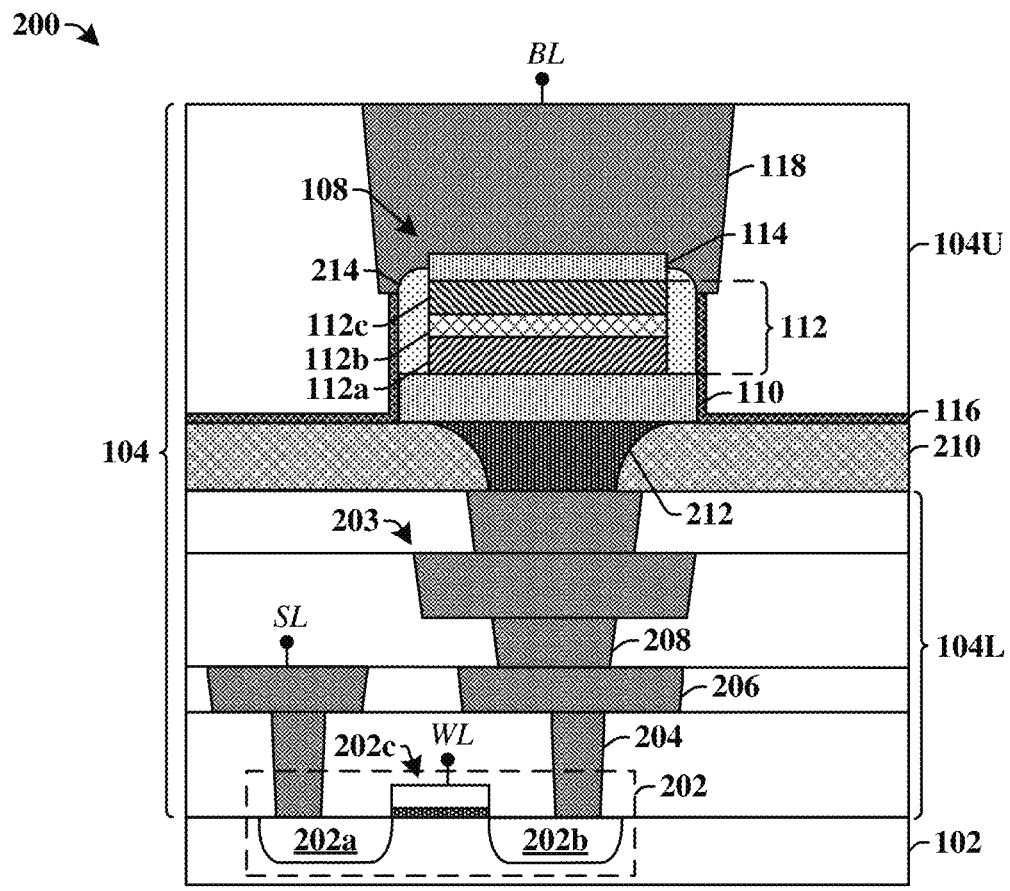
FIG. 2 illustrates a cross-sectional view of some additional embodiments of an integrated chip having a disclosed etch stop layer.

FIG. 2 illustrates some additional embodiments of an integrated chip 200 having an etch stop layer that configured to prevent damage to a memory device.

The integrated chip 200 comprises a memory device 108 disposed within a dielectric structure 104 arranged over a substrate 102. In some embodiments, the dielectric structure 104 comprises one or more lower ILD layers 104L and one or more upper ILD layers 104U. The one or more lower ILD layers 104L laterally surround one or more lower interconnect layers 203. In some embodiments, the one or more lower interconnect layers 203 comprise conductive contacts 204, interconnect wires 206, and interconnect vias 208. The one or more upper ILD layers 104U laterally surround the memory device 108. In some embodiments, the one or more lower ILD layers 104L and/or the one or more upper ILD layers 104U may comprise one or more of silicon dioxide, SiCOH, borosilicate glass (BSG), phosphosilicate glass (PSG), borophosphosilicate glass (BPSG), fluorosilicate glass (FSG), undoped silicate glass (USG), or the like. In some embodiments, the one or more lower interconnect layers 203 may comprise one or more of copper, aluminum, tungsten, ruthenium, or the like.

The one or more lower interconnect layers 203 are configured to couple the memory device 108 to an access device 202 disposed within the substrate 102. In some embodiments, the access device 202 may comprise a MOSFET (metal-oxide-semiconductor field-effect transistor) device. In some such embodiments, the MOSFET device may comprise a planar FET having a gate structure 202c that is laterally arranged between a source region 202a and a drain region 202b. In some embodiments, the gate structure 202c may comprise a gate electrode that is separated from the substrate 102 by a gate dielectric. In some such embodiments, the source region 202a is coupled to a source-line SL and the gate structure 202c is coupled to a word-line WL. In other embodiments, the access device 202 may comprise a FinFET, a nanostructure FET (i.e., a gate-all-around FET), or the like. In yet other embodiments, the access device 202 may comprise a HEMT (high electron mobility transistor), a BJT (bipolar junction transistor), a JFET (junction gate field-effect transistor), or the like.

A lower insulating structure 210 is arranged over the one or more lower ILD layers 104L. The lower insulating structure 210 comprises sidewalls that define an opening extending through the lower insulating structure 210. In various embodiments, the lower insulating structure 210 may comprise one or more of silicon nitride, silicon dioxide, silicon carbide, or the like. A bottom electrode via 212 is arranged between the sidewalls of the lower insulating structure 210. The bottom electrode via 212 extends from one of the lower interconnect layers 203 to a top of the lower insulating structure 210. In some embodiments, the bottom electrode via 212 may comprise one or more of titanium, titanium nitride, tantalum, tantalum nitride, or the like.

The memory device 108 is arranged on the bottom electrode via 212. In some embodiments, the memory device 108 comprises a bottom electrode 110 that is separated from a top electrode 114 by way of a data storage structure 112. In some embodiments, the bottom electrode 110 and the top electrode 114 may comprise a metal, such as tantalum, titanium, tantalum nitride, titanium nitride, platinum, nickel, hafnium, zirconium, ruthenium, iridium, or the like.

In some embodiments, the data storage structure 112 comprises a magnetic tunnel junction (MTJ). In such embodiments, the data storage structure 112 may comprise a pinned layer 112a separated from a free layer 112c by a dielectric tunnel barrier 112b. The pinned layer 112a has a magnetization that is fixed, while the free layer 112c has a magnetization that can be changed during operation (through the tunnel magnetoresistance (TMR) effect) to be either parallel (i.e., a 'P' state) or anti-parallel (i.e., an 'AP' state) with respect to the magnetization of the pinned layer 112a. In some embodiments, the pinned layer 112a may comprise cobalt, iron, boron, nickel, ruthenium, iridium, platinum, or the like. In some embodiments, the dielectric tunnel barrier 112b may comprise magnesium oxide, aluminum oxide, nickel oxide, gadolinium oxide, tantalum oxide, molybdenum oxide, titanium oxide, tungsten oxide, or the like. In some embodiments, the free layer 112c may comprise cobalt, iron, boron, iron cobalt, nickel cobalt, cobalt iron boride, iron boride, iron platinum, iron palladium, or the like.

In some embodiments, one or more sidewall spacers 214 may be disposed along sidewalls of the data storage structure 112 and the top electrode 114. In some embodiments, the top electrode 114 protrudes outward from a top of the one or more sidewall spacers 214. In some embodiments, the one or more sidewall spacers 214 may comprise an oxide (e.g., silicon rich oxide), a nitride (e.g., silicon nitride), a carbide (e.g., silicon carbide), or the like.

An etch stop layer 116 is disposed over the lower insulating structure 210 and the memory device 108. The etch stop layer 116 extends along sidewalls of the bottom electrode 110 and the one or more sidewall spacers 214. In some embodiments, the one or more sidewall spacers 214 may extend vertically above an uppermost surface of the etch stop layer 116. In some embodiments, the etch stop layer 116 may comprise a metal oxide, a metal nitride, or the like. For example, in some embodiments, the etch stop layer 116 may comprise aluminum oxide, aluminum nitride, or the like. In some embodiments, the etch stop layer 116 may have a thickness that is in a range of between approximately 5 Angstroms (Å) and approximately 50 Å, between approximately 10 Å and approximately 30 Å, or other suitable values.

An upper interconnect wire 118 is arranged within the one or more upper ILD layers 104U and is coupled to the top electrode 114. The upper interconnect wire 118 extends laterally past opposing sidewalls of the top electrode 114. In some embodiments, the upper interconnect wire 118 may further extend past opposing sidewalls of the etch stop layer 116. In some embodiments, the upper interconnect wire 118 may extend along sidewalls of both the top electrode 114 and the sidewall spacers 214. In some embodiments, the upper interconnect wire may contact an upper surface of the etch stop layer 116 along an interface that is below a top of the top electrode 114. In some embodiments, the upper interconnect wire 118 may comprise aluminum, copper, tungsten, or the like. In some embodiments, the upper interconnect wire 118 is further coupled to a bit-line BL.

Figure 3:
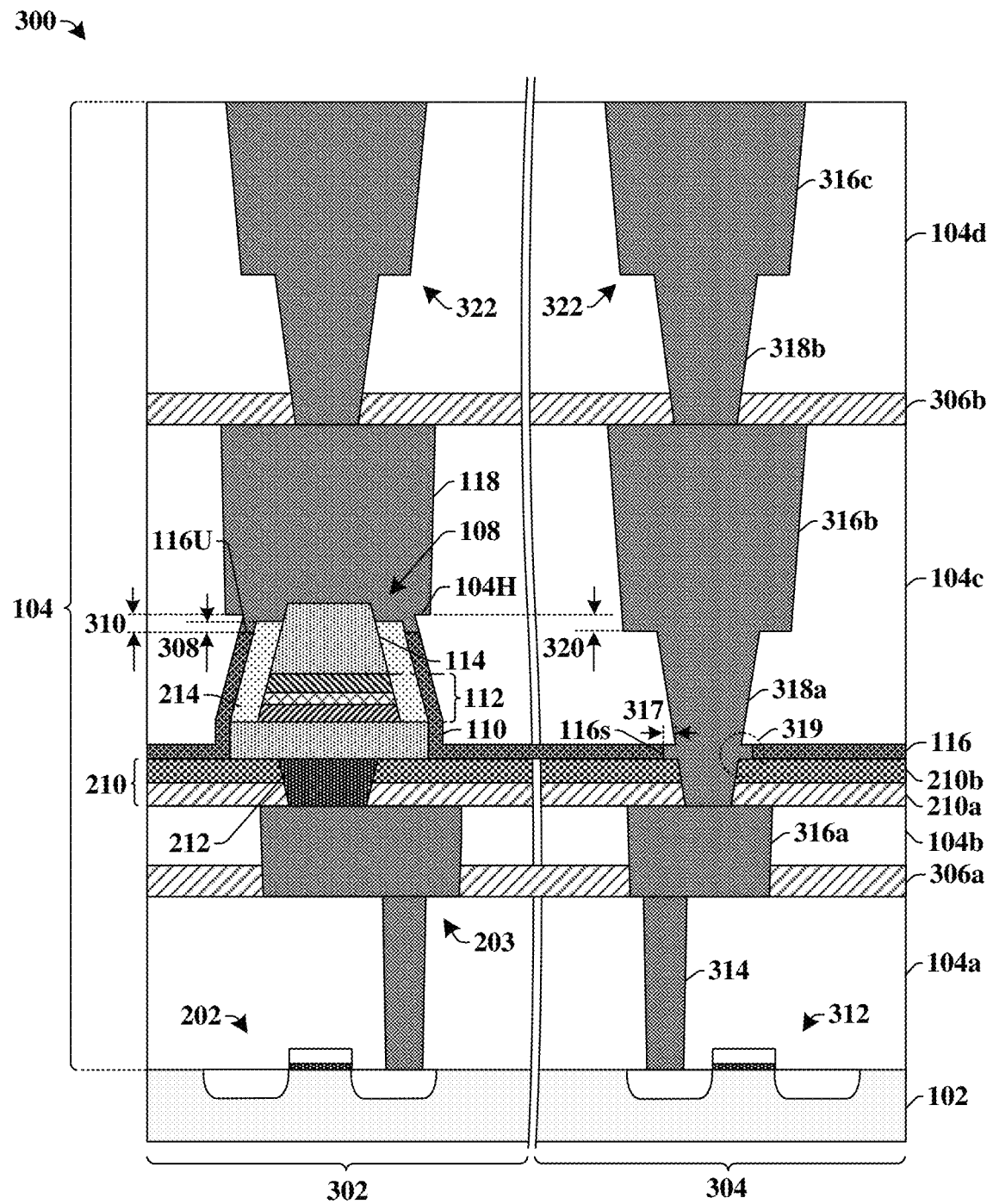
FIG. 3 illustrates a cross-sectional view of some additional embodiments of an integrated chip having a disclosed etch stop layer.

FIG. 3 illustrates some additional embodiments of an integrated chip 300 having a disclosed etch stop layer.

The integrated chip 300 comprises a substrate 102 including an embedded memory region 302 and a logic region 304. A dielectric structure 104 is arranged over the substrate 102. The dielectric structure 104 comprises a plurality of stacked ILD layers 104a-104d. In some embodiments, two or more adjacent ones of the plurality of stacked ILD layers 104a-104d may be separated by an etch stop layers 306a-306b. In various embodiments, the etch stop layers 306a-306b may comprise a nitride (e.g., silicon nitride), a carbide (e.g., silicon carbide), or the like.

The embedded memory region 302 comprises an access device 202 arranged on and/or within the substrate 102. The access device 202 is coupled to plurality of lower interconnect layers 203 disposed within a plurality of lower ILD layers 104a-104b. A lower insulating structure 210 is disposed over the plurality of lower ILD layers 104a-104b. In some embodiments, the lower insulating structure 210 may comprise two or more stacked dielectric materials. For example, the lower insulating structure 210 may comprise a first dielectric layer 210a and a second dielectric layer 210b over the first dielectric layer 210a. In some embodiments, the first dielectric layer 210a may comprise silicon rich oxide, silicon carbide, silicon nitride, or the like. In some embodiments, the second dielectric layer 210b may comprise silicon carbide, silicon nitride, or the like.

A bottom electrode via 212 extends through the lower insulating structure 210, between one of the plurality of lower interconnect layers 203 and a memory device 108 that overlies the lower insulating structure 210. The memory device 108 is disposed within a first upper ILD layer 104c on the lower insulating structure 210. In some embodiments, one or more sidewall spacers 214 are arranged on opposing sides of the memory device 108. An etch stop layer 116 is arranged on the lower insulating structure 210 and extends along opposing sides of the memory device 108 and the one or more sidewall spacers 214. In some embodiments, the etch stop layer 116 may have a first upper surface 116U that is recessed a first distance 308 below a top of the one or more sidewall spacers 214 and/or that is recessed a second distance 310 below a horizontally extending surface 104H of the first upper ILD layer 104c. The recessed first upper surface 116U of the etch stop layer 116 is due to a selectivity of a wet cleaning chemical or etchant used to remove the etch stop layer 116. For example, during fabrication of the integrated chip 300 a dry etchant may etch the first upper ILD layer 104c and expose an upper surface of the etch stop layer 116. A wet cleaning chemical or etchant may be used to subsequently remove exposed surfaces of the etch stop layer 116 and to recess the etch stop layer 116. In some embodiments, the first distance 308 may be in a range of between approximately 5 nm and approximately 40 nm, between approximately 10 nm and approximately 30 nm, or other suitable values. In some embodiments, the second distance 310 may be in a range of between approximately 5 nm and approximately 50 nm, between approximately 10 nm and approximately 40 nm, or other suitable values.

The logic region 304 comprises a transistor device 312 arranged on and/or within the substrate 102. The transistor device 312 is coupled to a plurality of interconnect layers 314-318b surrounded by the dielectric structure 104. The plurality of interconnect layers 314-318b comprise a conductive contact 314, interconnect wires 316a-316c, and/or interconnect vias 318a-318b. In some embodiments, the plurality of interconnect layers 314-318b comprise an interconnect via 318a and an interconnect wire 316b disposed within the first upper ILD layer 104c. The interconnect via 318a is laterally separated from the memory device 108 and the interconnect wire 316b is laterally separated from an upper interconnect wire 118 on the memory device 108. In some embodiments, the interconnect wire 316b extends from a top of the first upper ILD layer 104c to a position that is vertically offset from the horizontally extending surface 104H of the first upper ILD layer 104c by a distance 320. In other embodiments (not shown), the interconnect wire 316b extends from a top of the first upper ILD layer 104c to a position that is substantially aligned with the horizontally extending surface 104H. In some embodiments, the interconnect via 318a vertically extends from below a bottom of the etch stop layer 116 to over a top of the etch stop layer 116. In some embodiments, the plurality of interconnect layers 314-318b may comprise one or more of copper, tungsten, aluminum, or the like.

In some embodiments, the etch stop layer 116 may have a sidewall 116s facing the interconnect via 318a. The sidewall 116s is laterally set-back by a non-zero distance 317 from a sidewall of the lower insulating structure 210 and/or a sidewall of the first upper ILD layer 104c that faces the interconnect via 318a. The lateral set-back of the sidewall 116s of the etch stop layer 116 causes the interconnect via 318a to have protrusions 319 that protrude outward from a sidewall of the interconnect via 318a between the first upper ILD layer 104c and the lower insulating structure 210. The lateral set-back is due to lateral removal of the etch stop layer 116 caused by a wet cleaning chemical or etchant used to remove a part of the etch stop layer 116 during fabrication of the integrated chip 300.

Figure 4:
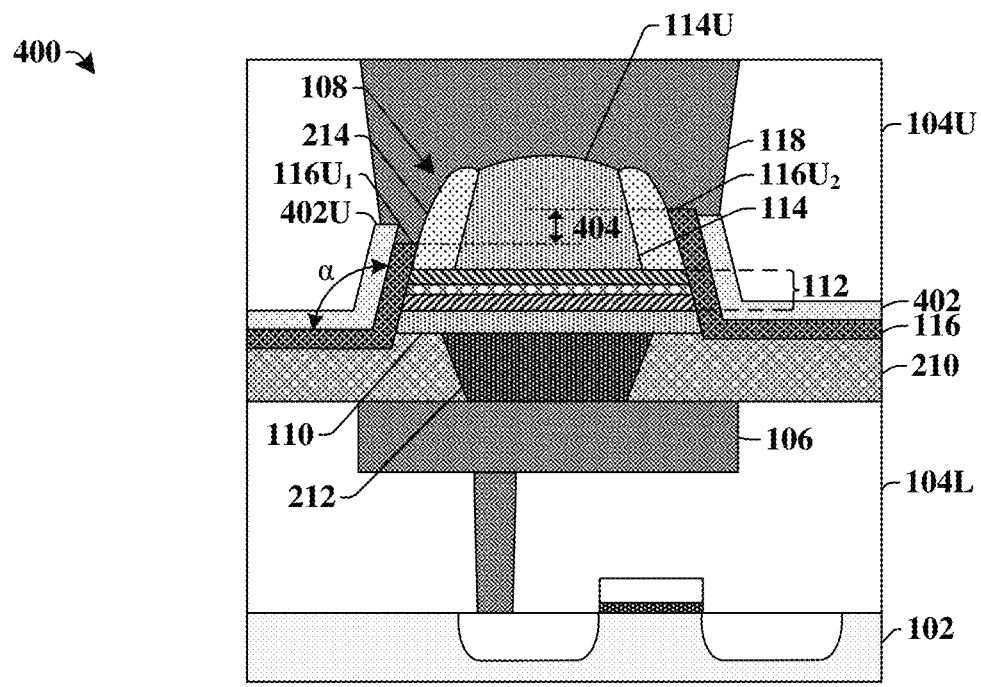
FIG. 4 illustrates a cross-sectional view of some additional embodiments of an integrated chip having a disclosed etch stop layer.

FIG. 4 illustrates some additional embodiments of an integrated chip 400 having a disclosed etch stop layer.

The integrated chip 400 comprises a memory device 108 disposed over a substrate 102. The memory device 108 is coupled to a lower interconnect 106 by way of a bottom electrode via 212 extending through a lower insulating structure 210. In some embodiments, the memory device 108 comprises a data storage structure 112 arranged between a bottom electrode 110 and a top electrode 114. In some embodiments, the top electrode 114 may have a greater height along a center of the top electrode 114 than along outer edges of the top electrode 114. In some embodiments, the upper surface 114U of the top electrode 114 may have a substantially rounded profile.

An etch stop layer 116 and an upper insulating structure 402 separate the lower insulating structure 210 from one or more upper ILD layers 104U surrounding the memory device 108. In some embodiments, the upper insulating structure 402 comprises one or more stacked dielectric materials. For example, the upper insulating structure 402 may comprise one or more of a carbide, a nitride, an oxide, or the like. In some embodiments, the upper insulating structure 402 may be disposed over the etch stop layer 116. In other embodiment (not shown), the upper insulating structure 402 may be disposed below the etch stop layer 116.

In some embodiments, the bottom electrode 110, the data storage structure 112, and the top electrode 114 have tapered sidewalls. For example, the tapered sidewalls of the bottom electrode 110 cause a bottom surface of the bottom electrode 110 to have a greater width than a top surface of the bottom electrode 110. In some embodiments, the etch stop layer 116 has a sidewall that is angled at an angle α that is greater than 90° with respect to an upper surface of the etch stop layer 116.

In some embodiments, the etch stop layer 116 has a first upper surface $116U_1$ that is vertically offset from (e.g., above or below) an upper surface 402U of the upper insulating structure 402. In some embodiments, the first upper surface $116U_1$ of the etch stop layer 116 may be arranged along a first side of the memory device 108 and a second upper surface $116U_2$ of the etch stop layer 116 may be arranged along an opposing second side of the memory device 108. In some embodiments, the first upper surface $116U_1$ and the second upper surface $116U_2$ may be disposed at different heights over the substrate 102 due to variations in processes used to remove the etch stop layer 116 during fabrication of the integrated chip 400. In some embodiments, the first upper surface $116U_1$ may be separated from the second upper surface $116U_2$ by a vertical distance 404 that is in a range of between approximately 5 nm and approximately 20 nm, between approximately 5 nm and approximately 10 nm, or other similar values.

Figure 5:
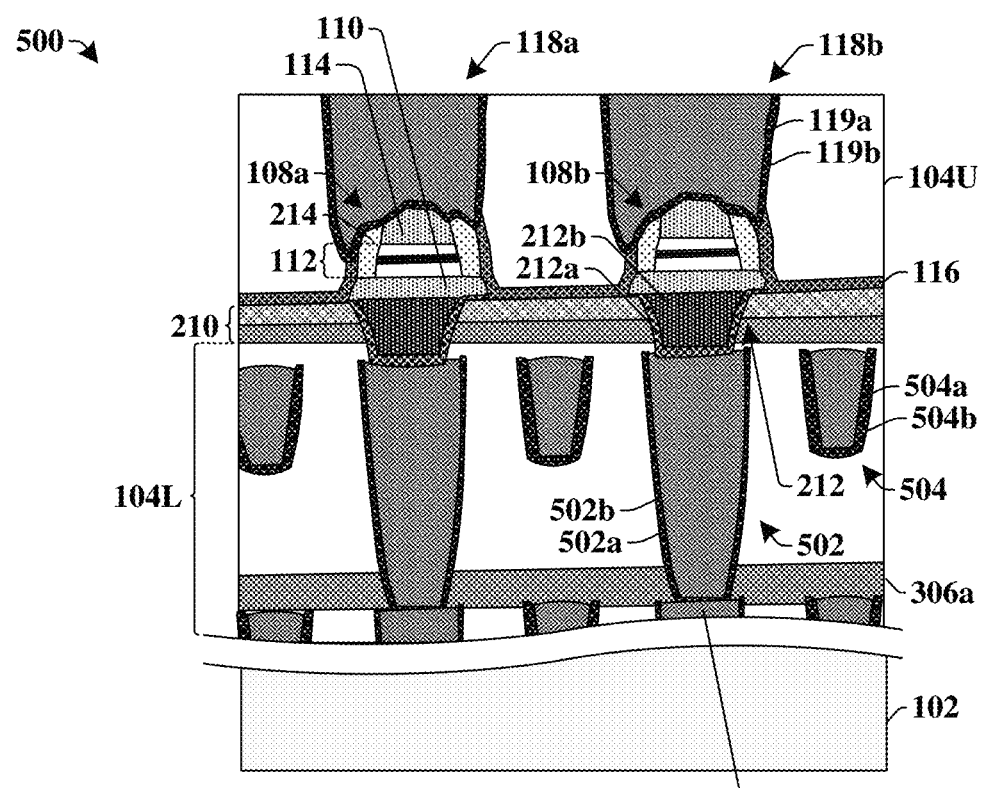
FIG. 5 illustrates cross-sectional views of some additional embodiments of an integrated chip having a disclosed etch stop layer.

FIG. 5 illustrates some additional embodiments of an integrated chip 500 having a disclosed etch stop layer.

The integrated chip 500 comprises a plurality of memory devices 108a-108b disposed over a substrate 102. The plurality of memory devices 108a-108b respectively comprise a data storage structure 112 disposed between a bottom electrode 110 and a top electrode 114. In some embodiments, the plurality of memory devices 108a-108b are laterally surrounded by one or more sidewall spacers 214. The plurality of memory devices 108a-108b are also laterally surrounded by one or more upper ILD layers 104U. The one or more upper ILD layers 104U are separated from the substrate 102 by way of one or more lower ILD layers 104L and a lower insulating structure 210. A plurality of lower interconnects are arranged within the one or more lower ILD layers 104L.

In some embodiments, the plurality of lower interconnects comprise active interconnects 502 and dummy interconnects 504. The active interconnects 502 extend between an underlying interconnect 506 and a bottom electrode via 212. The dummy interconnects 504 are disposed laterally between the active interconnects 502 and have a bottom surface that is completely covered by the one or more lower ILD layers 104L. In some embodiments, the lower insulating structure 210 also continuously extends past opposing sides of the dummy interconnects 504. In some embodiments, the dummy interconnects 504 respectively have a height that is smaller than a height of the active interconnects 502. In some embodiments, the dummy interconnects 504 respectively have a width that is smaller than a width of the active interconnects 502.

In some embodiments, the active interconnects 502 comprise a conductive core 502a and a barrier layer 502b surrounding the conductive core 502a. The barrier layer 502b separates the conductive core 502a from the one or more lower ILD layers 104L and is configured to prevent diffusion of atoms of the conductive core 502a to within the one or more lower ILD layers 104L. In some embodiments, the dummy interconnects 504 also comprise a conductive core 504a and a barrier layer 504b surrounding the conductive core 504a. In some embodiments, the bottom electrode via 212 also comprises a barrier layer 212a and a conductive core 212b.

A plurality of upper interconnect wires 118a-118b are disposed on the plurality of memory devices 108a-108b. In some embodiments, the plurality of upper interconnect wires 118a-118b comprise a conductive core 119a and a barrier layer 119b separating the conductive core 119a from the one or more upper ILD layers 104U. The plurality of upper interconnect wires 118a-118b continuously extend from directly over the plurality of memory devices 108a-108b to along one or more sides of the plurality of memory devices 108a-108b. In some embodiments, the plurality of upper interconnect wires 118a-118b have a bottommost point that is vertically below a top of the data storage structure 112. In some embodiments, the bottommost point is arranged vertically over the etch stop layer 116 and laterally outside of the sidewall spacers 214.

FIGS. 6-23 illustrate cross-sectional views 600-2300 of some embodiments of a method of forming an integrated chip having an etch stop layer configured to improve formation of a memory device. Although FIGS. 6-23 are described in relation to a method, it will be appreciated that the structures disclosed in FIGS. 6-23 are not limited to such a method, but instead may stand alone as structures independent of the method.

Figure 6:
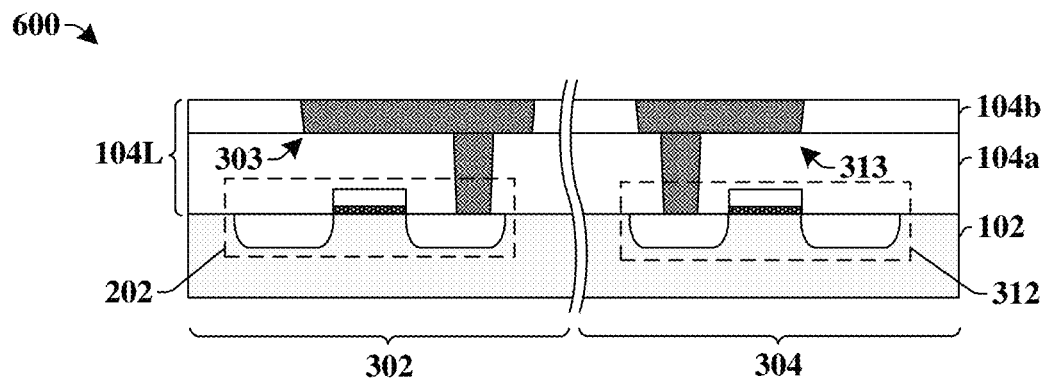
FIGS. 6-23 illustrate cross-sectional views of some embodiments of a method of forming an integrated chip having an etch stop layer configured to improve a process used to form a memory device.

As shown in cross-sectional view 600 of FIG. 6, a substrate 102 is provided. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, the substrate 102 comprises an embedded memory region 302 and a logic region 304. In some embodiments, an access device 202 is formed within the embedded memory region 302 and a transistor device 312 is formed within the logic region 304. In some embodiments, the access device 202 and/or the transistor device 312 may comprise a MOSFET. In some such embodiments, the access device 202 and/or the transistor device 312 may comprise a planar FET formed by depositing a gate dielectric film and a gate electrode film over the substrate 102. The gate dielectric film and the gate electrode film are subsequently patterned to form a gate dielectric and a gate electrode. The substrate 102 may be subsequently implanted to form a source region and a drain region within the substrate 102 on opposing sides of the gate electrode. In other embodiments, the access device 202 and/or the transistor device 312 may comprise a FinFET, a nanostructure FET (i.e., a gate-all-around FET), or the like. In yet other embodiments, the access device 202 and/or the transistor device 312 may comprise a HEMT, a BJT, a JFET, or the like.

In some embodiments, one or more lower interconnect layers 303 and 313 may be formed within one or more lower ILD layers 104L formed over the substrate 102. In some embodiments, the one or more lower ILD layers 104L may comprise a first lower ILD layer 104a and a second lower ILD layer 104b. In some embodiments, the one or more lower interconnect layers 303 and 313 may comprise a first plurality of lower interconnect layers 303 disposed within the embedded memory region 302 and a second plurality of lower interconnect layers 313 disposed within the logic region 304. In some embodiments, one or more lower interconnect layers 303 and 313 may comprise one or more of a conductive contact, an interconnect wire, and/or an interconnect via. The one or one or more lower interconnect layers 303 and 313 may be formed by forming a lower ILD layer of the one or more lower ILD layers 104a-104b over the substrate 102, selectively etching the lower ILD layer to define a via hole and/or a trench within the lower ILD layer, forming a conductive material (e.g., copper, aluminum, etc.) within the via hole and/or the trench, and performing a planarization process (e.g., a chemical mechanical planarization process) to remove excess of the conductive material from over the lower ILD layer.

Figure 7:
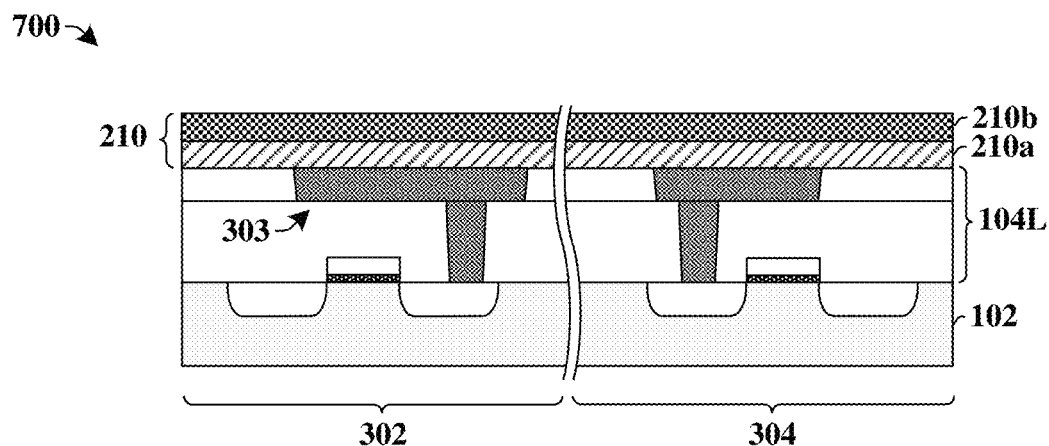

As shown in cross-sectional view 700 of FIG. 7, a lower insulating structure 210 is formed over the one or more lower ILD layers 104L. In some embodiments, the lower insulating structure 210 comprises a plurality of different stacked dielectric materials. For example, in some embodiments, the lower insulating structure 210 comprises a first dielectric layer 210a and a second dielectric layer 210b over the first dielectric layer 210a. In some embodiments, the first dielectric layer 210a may comprise silicon rich oxide, silicon carbide, silicon nitride, or the like. In some embodiments, the second dielectric layer 210b may comprise silicon carbide, silicon nitride, or the like. In some embodiments, the lower insulating structure 210 may be formed by one or more deposition processes (e.g., a physical vapor deposition (PVD) process, a chemical vapor deposition (CVD) process, a plasma enhanced CVD (PE-CVD) process, or the like).

Figure 8:
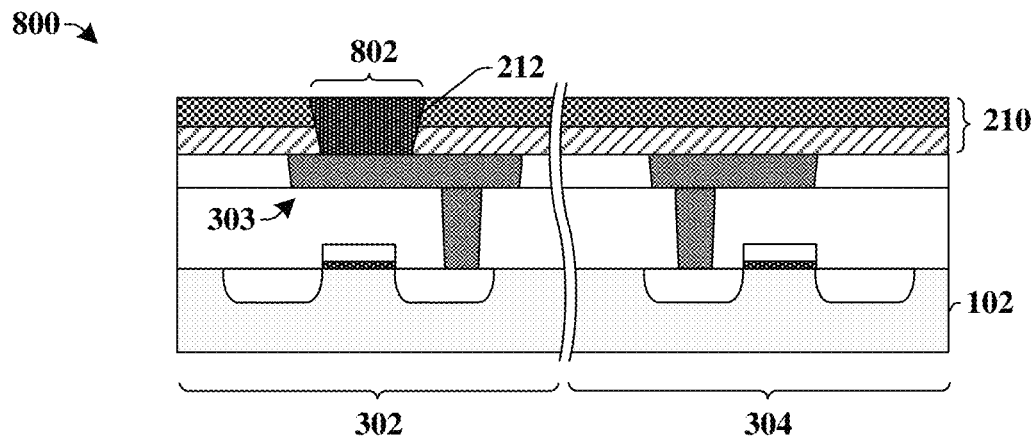

As shown in cross-sectional view 800 of FIG. 8, a bottom electrode via 212 is formed within the lower insulating structure 210. The bottom electrode via 212 extends through the lower insulating structure 210 to the first plurality of lower interconnect layers 303. In some embodiments, the bottom electrode via 212 may be formed by selectively patterning the lower insulating structure 210 to form an opening 802 that extends through the lower insulating structure 210 and that exposes an upper surface of the first plurality of lower interconnect layers 303. One or more conductive materials are subsequently formed within the opening 802 and over an upper surface of the lower insulating structure 210. In some embodiments, the one or more conductive materials may comprise a diffusion barrier layer and/or an overlying metal layer. In some embodiments, the diffusion barrier layer and/or the metal layer may be formed by deposition processes (e.g., a PVD process, a CVD process, a PE-CVD process, or the like). In some embodiments, a planarization process (e.g., a chemical mechanical planarization (CMP) process) may be performed after the deposition processes to remove excess material of the diffusion barrier layer and/or the metal layer from over the lower insulating structure 210.

Figure 9:
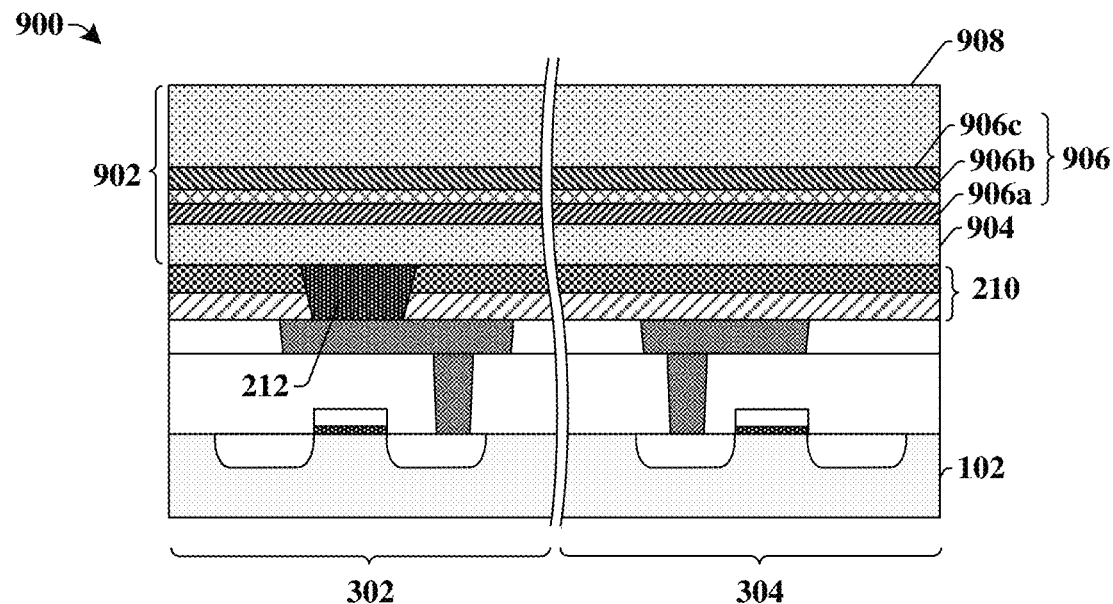

As shown in cross-sectional view 900 of FIG. 9, a memory device stack 902 is formed over the lower insulating structure 210 and the bottom electrode via 212. The memory device stack 902 comprises a bottom electrode layer 904, one or more data storage layers 906 over the bottom electrode layer 904, and a top electrode layer 908 over the one or more data storage layers 906. In some embodiments, the bottom electrode layer 904, the one or more data storage layers 906, and the top electrode layer 908 may be formed by deposition processes (e.g., a PVD process, a CVD process, a PE-CVD process, or the like).

In some embodiments, the bottom electrode layer 904 and/or the top electrode layer 908 may comprise a metal, such as titanium, tantalum, titanium nitride, tantalum nitride, or the like. In some embodiments, the one or more data storage layers 906 may comprise a magnetic reference layer 906a, a tunnel layer 906b, and a magnetic free layer 906c. In some embodiments, the magnetic reference layer 906a may comprise cobalt, iron, boron, nickel, ruthenium, iridium, platinum, or the like. In some embodiments, the tunnel layer 906b may comprise magnesium oxide, aluminum oxide, nickel oxide, gadolinium oxide, tantalum oxide, molybdenum oxide, titanium oxide, tungsten oxide, or the like. In some embodiments, the magnetic free layer 906c may comprise cobalt, iron, boron, iron cobalt, nickel cobalt, cobalt iron boride, iron boride, iron platinum, iron palladium, or the like.

Figure 10:
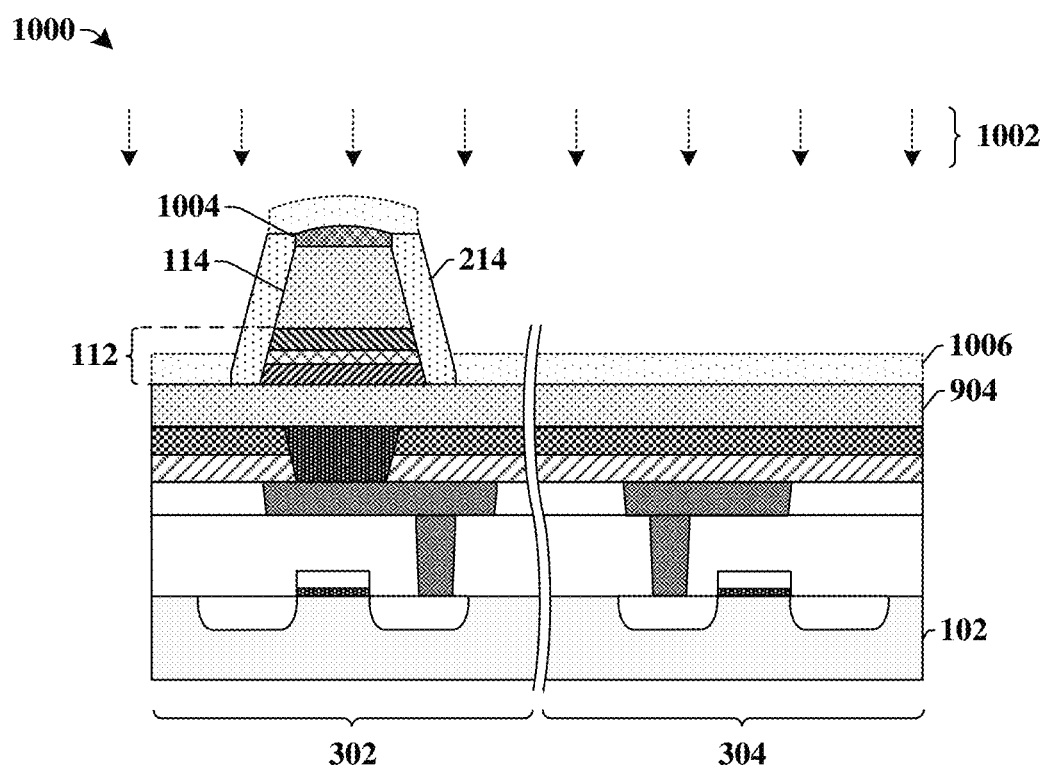

As shown in cross-sectional view 1000 of FIG. 10, a first patterning process is performed on the top electrode layer (908 of FIG. 9) and the one or more data storage layers (906 of FIG. 9) to form a top electrode 114 and a data storage structure 112. In some embodiments, the first patterning process selectively exposes the top electrode layer (908 of FIG. 9) and the one or more data storage layers (906 of FIG. 9) to a first etchant 1002 according to a hard mask layer 1004 (e.g., titanium, titanium nitride, tantalum, silicon-nitride, silicon-carbide, etc.). In some embodiments, the first etchant 1002 may comprise a dry etchant (e.g., having a fluorine or chlorine based etching chemistry). In some embodiments, the data storage structure 112 may comprise a magnetic tunnel junction (MTJ).

After the first patterning process is completed, one or more sidewall spacers 214 are formed along sidewalls of the top electrode 114 and the data storage structure 112. In various embodiments, the one or more sidewall spacers 214 may comprise silicon nitride, silicon dioxide, silicon oxynitride, and/or the like. In some embodiments, the one or more sidewall spacers 214 may be formed by forming a spacer layer 1006 over the substrate 102. The spacer layer 1006 is subsequently exposed to an etchant (e.g., a dry etchant), which removes the spacer layer 1006 from horizontal surfaces. Removing the spacer layer 1006 from horizontal surfaces leaves a part of the spacer layer 1006 along opposing sidewalls of the top electrode 114 and the data storage structure 112 as the one or more sidewall spacers 214.

Figure 11:
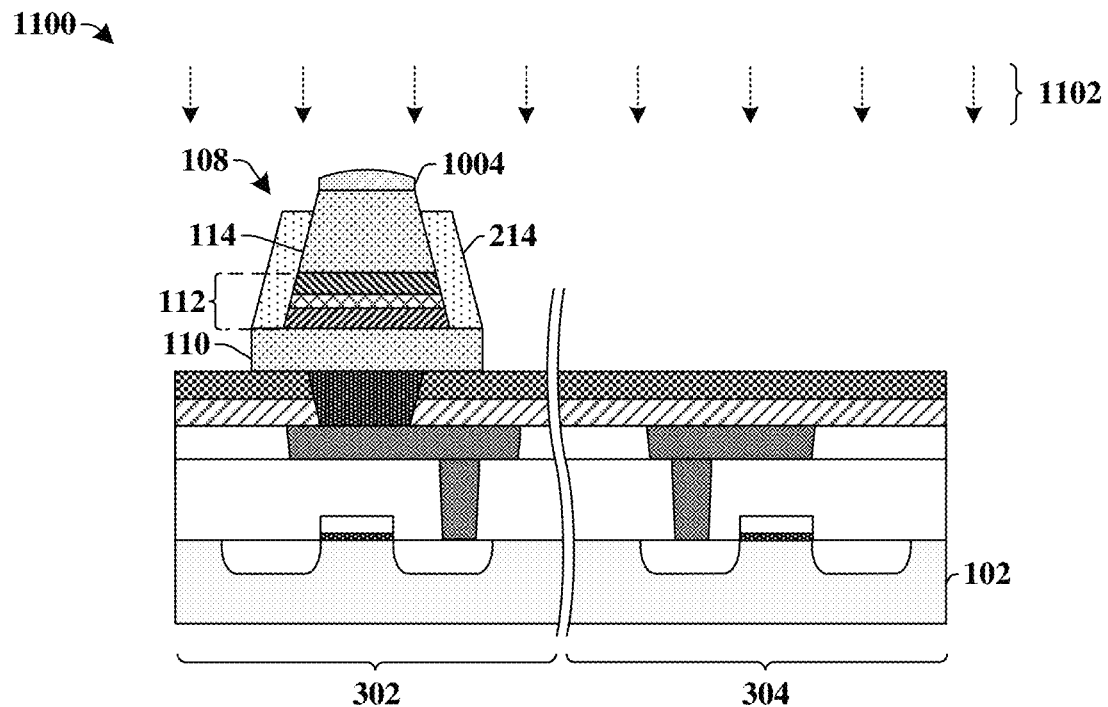

As shown in cross-sectional view 1100 of FIG. 11, a second patterning process is performed on the bottom electrode layer (904 of FIG. 10) to define a memory device 108 having a data storage structure 112 disposed between a bottom electrode 110 and the top electrode 114. In some embodiments, the second patterning process selectively exposes the bottom electrode layer (904 of FIG. 10) to a second etchant 1102 in areas that are not covered by the hard mask layer 1004 and the one or more sidewall spacers 214. In some embodiments, the second etchant 1102 may comprise a dry etchant (e.g., having a fluorine or chlorine based etching chemistry). In some embodiments, the hard mask layer 1004 may be removed after the second patterning process is completed.

Figure 12:
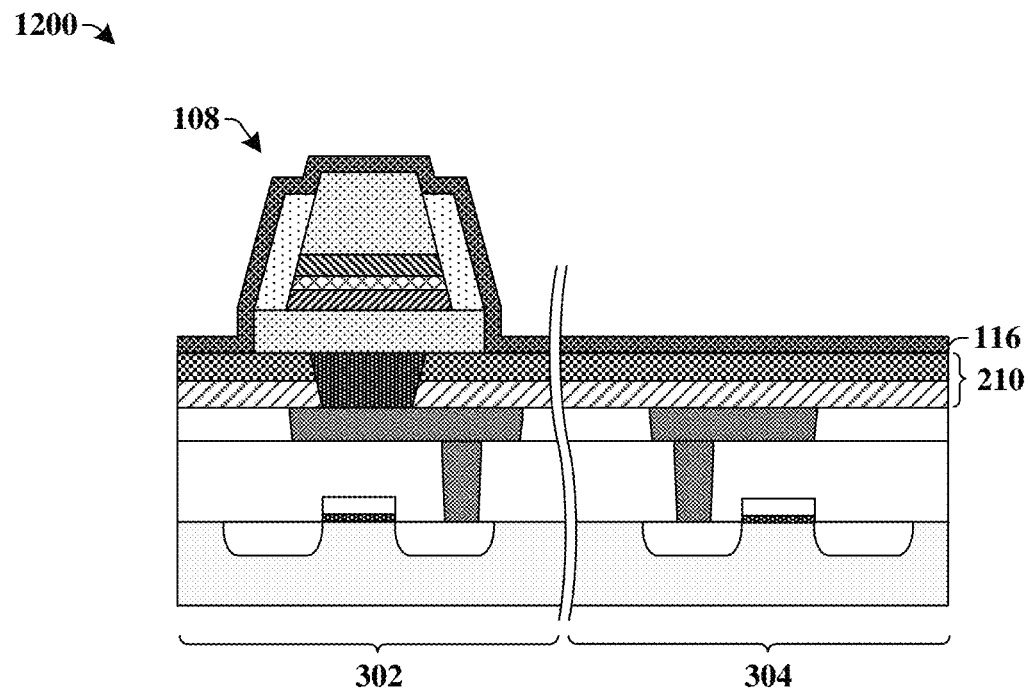

As shown in cross-sectional view 1200 of FIG. 12, an etch stop layer 116 is formed over the lower insulating structure 210 and the memory device 108. The etch stop layer 116 is formed to continuously extend along an upper surface of the lower insulating structure 210 and along sidewalls and an upper surface of the memory device 108. In some embodiments, the etch stop layer 116 may comprise a metal oxide, a metal nitride, or the like. For example, the etch stop layer 116 may comprise aluminum oxide, aluminum nitride, or the like. In some embodiments, the etch stop layer 116 may be formed by a deposition process (e.g., a PVD process, a CVD process, a PE-CVD process, or the like).

Figure 13:
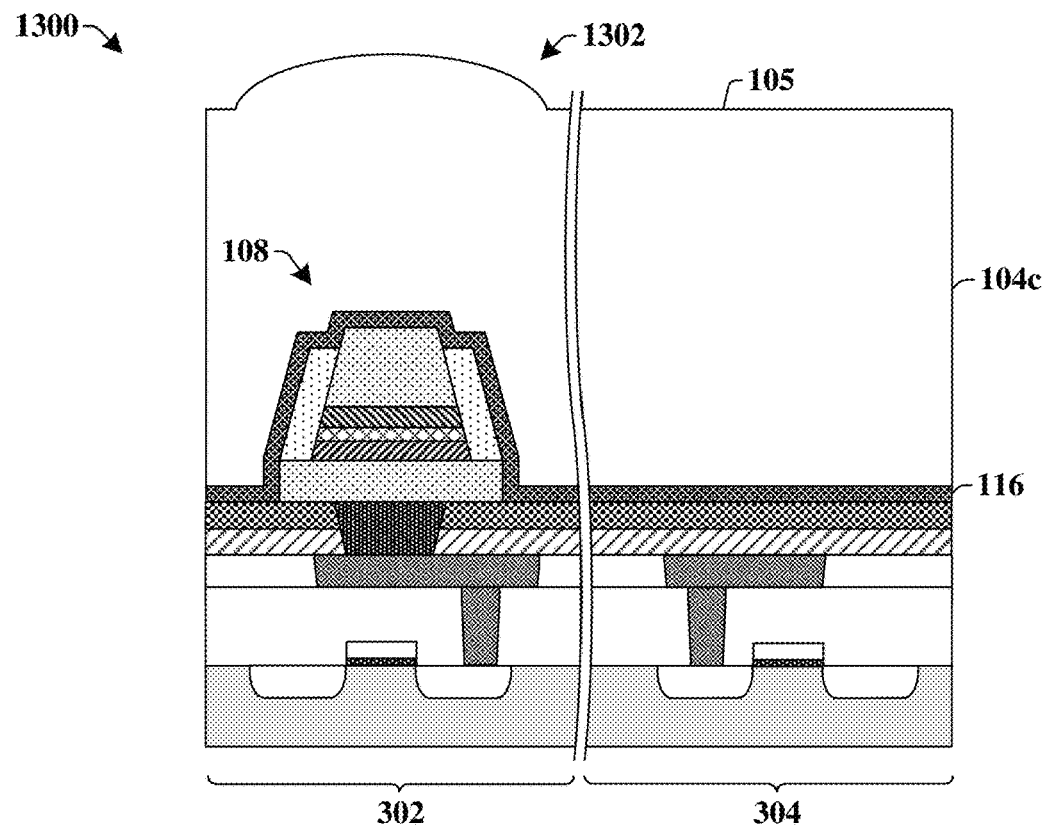

As shown in cross-sectional view 1300 of FIG. 13, a first upper ILD layer 104c is formed over the etch stop layer 116. In some embodiments, the first upper ILD layer 104c may be formed by a deposition process (e.g., PVD, CVD, PE-CVD, ALD, or the like). In some embodiments, the first upper ILD layer 104c may have a bump 1302 protruding outward from an upper surface 105 at a location that is directly over the memory device 108 due to a topography of the memory device 108. In some embodiments (not shown), an upper insulating structure (e.g., upper insulating structure 402 of FIG. 4) comprising one or more stacked dielectric materials may be formed onto the etch stop layer 116 prior to forming the first upper ILD layer 104c. In some embodiments, the one or more dielectric materials may comprise a nitride, a carbide, an oxide, or the like.

Figure 14:
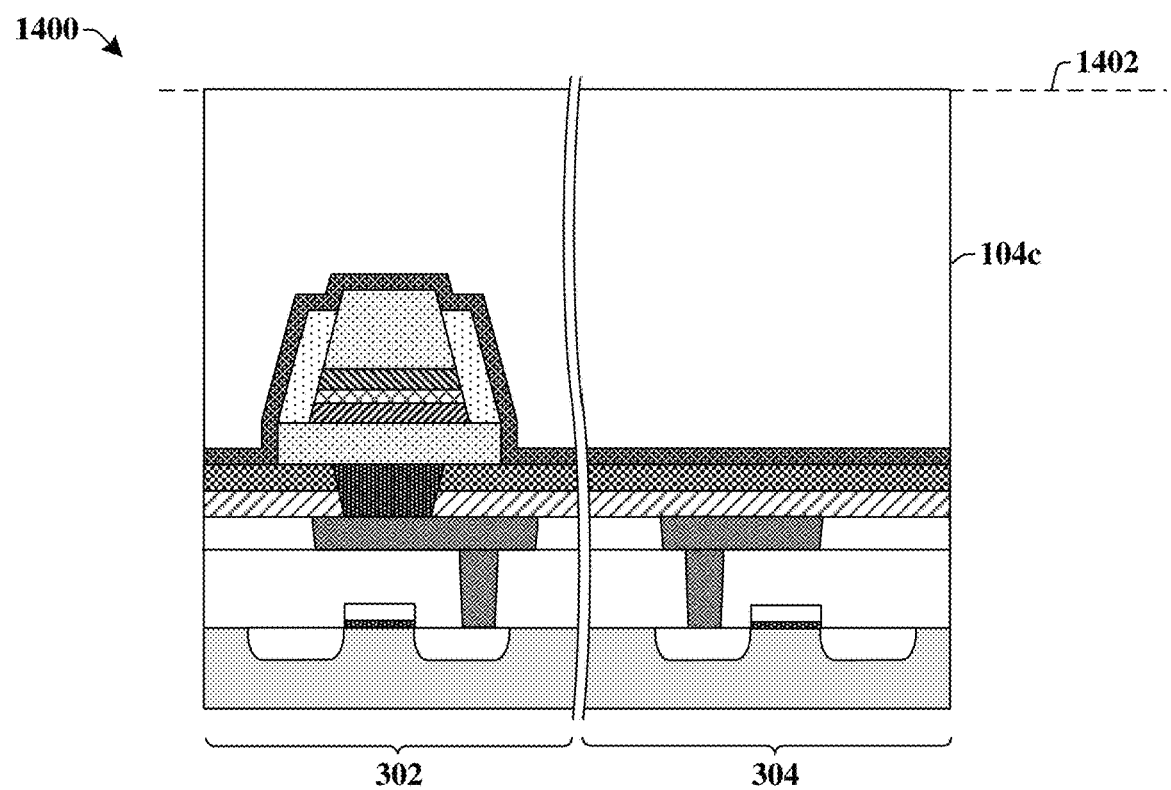

As shown in cross-sectional view 1400 of FIG. 14, a first planarization process (e.g., a CMP process) is performed on the first upper ILD layer 104c. The first planarization process is performed along line 1402 to remove a part of the first upper ILD layer 104c comprising the bump 1302 and to define a substantially flat upper surface extending over the memory device 108. In some embodiments, the first planarization process may comprise a chemical mechanical polishing (CMP) process.

Figure 15:
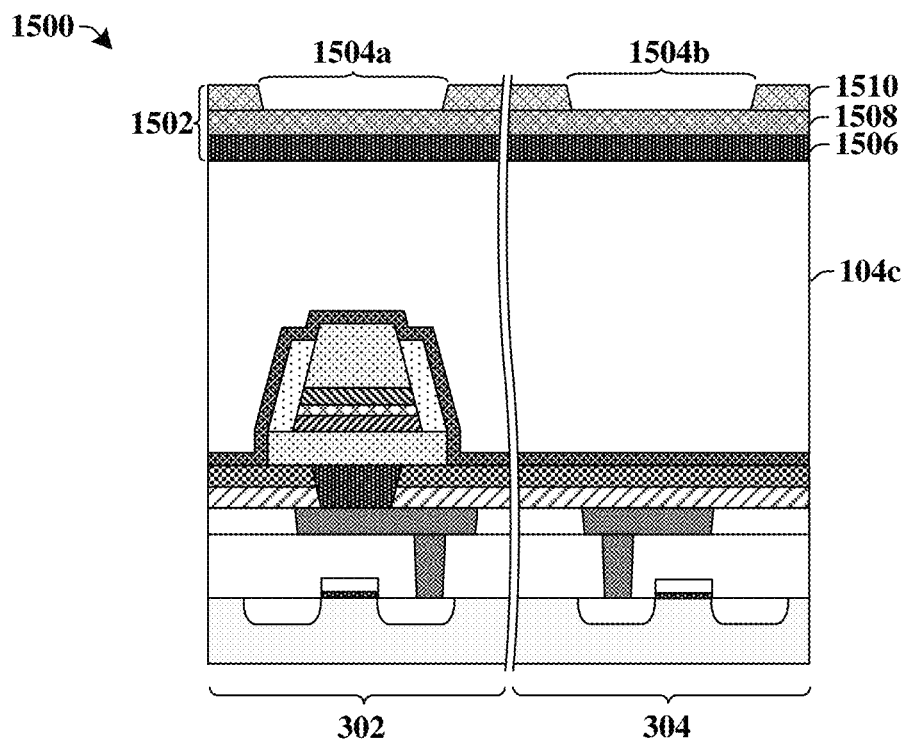

As shown in cross-sectional view 1500 of FIG. 15, a hard mask structure 1502 is formed over the first upper ILD layer 104c. The hard mask structure 1502 is subsequently patterned to have sidewalls defining a first opening 1504a over the memory device 108 and a second opening 1504b within the logic region 304. In some embodiments, the hard mask structure 1502 may comprise a multi-layer hard mask structure having a first hard mask layer 1506, a second hard mask layer 1508 over the first hard mask layer 1506, and a third hard mask layer 1510 over the second hard mask layer 1508. In some embodiments, the first hard mask layer 1506 may comprise a dielectric material, such as silicon dioxide, silicon nitride, silicon carbide, or the like. In some embodiments, the second hard mask layer 1508 may comprise an antireflective coating. In some embodiments, the third hard mask layer 1510 may comprise a metal such as titanium, titanium nitride, or the like. In some embodiments, the first opening 1504a and the second opening 1504b may be defined by way of sidewalls of the third hard mask layer 1510, while the first hard mask layer 1506 and the second hard mask layer 1508 may continuously extend between the sidewalls of the third hard mask layer 1510.

Figure 16:
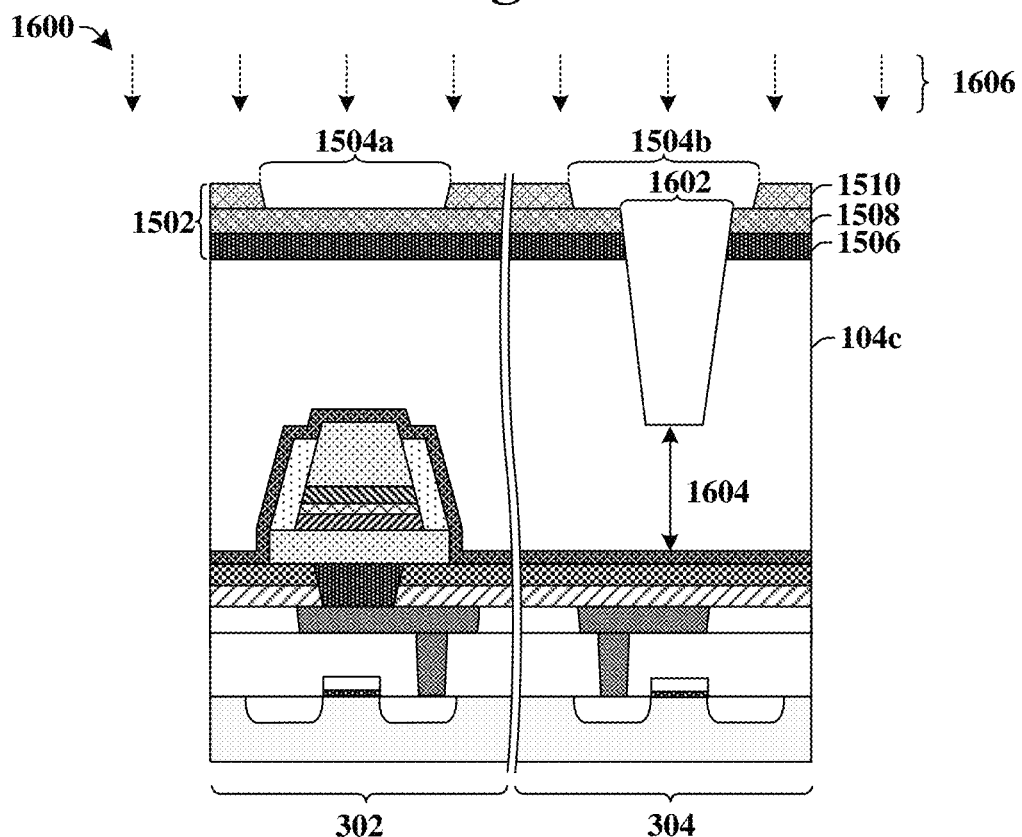

As shown in cross-sectional view 1600 of FIG. 16, a third patterning process is performed to define a via hole 1602 within the first upper ILD layer 104c in the logic region 304. The via hole 1602 extends through the hard mask structure 1502 to within the first upper ILD layer 104c. In some embodiments, the via hole 1602 is defined by sidewalls and a lower surface of the first upper ILD layer 104c. In some embodiments, first upper ILD layer 104c has a non-zero thickness 1604 below the via hole 1602. In some embodiments, the third patterning process selectively exposes the first upper ILD layer 104c to a third etchant 1606 in areas that are not covered by the hard mask structure 1502. In some embodiments, the third etchant 1606 may be a dry etchant (e.g., having a chlorine based etching chemistry, a fluorine based etching chemistry, or the like).

Figure 17:
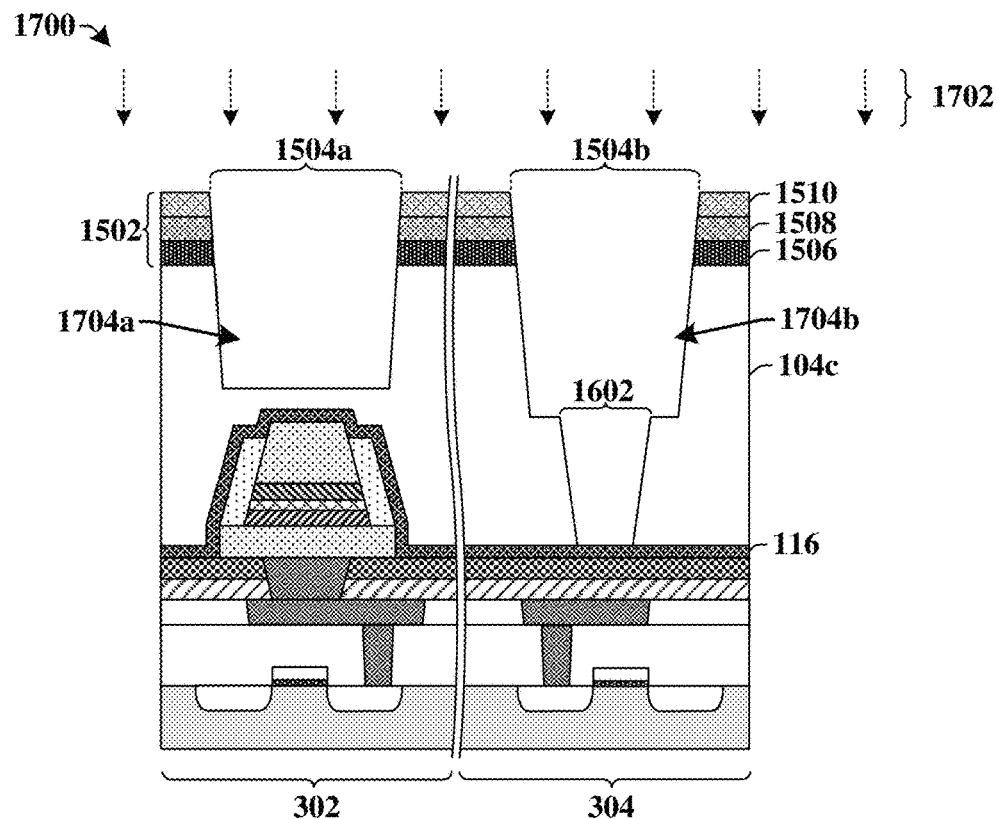

As shown in cross-sectional view 1700 of FIG. 17, a fourth patterning process is performed to define a first intermediate interconnect trench 1704a within the first upper ILD layer 104c in the embedded memory region 302 and a second intermediate interconnect trench 1704b within the first upper ILD layer 104c in the logic region 304. The fourth patterning process also increases a depth of the via hole 1602, so that the via hole 1602 exposes an upper surface of the etch stop layer 116 within the logic region 304, while the first upper ILD layer 104c separates the first intermediate interconnect trench 1704a from the etch stop layer 116 within the embedded memory region 302

In some embodiments, the fourth patterning process selectively exposes the first upper ILD layer 104c to a fourth etchant 1702 according to the first opening 1504a and the second opening 1504b of the hard mask structure 1502. In some embodiments, the fourth etchant 1702 may comprise a dry etchant (e.g., having a chlorine based etching chemistry, a fluorine based etching chemistry, or the like). In some embodiments, the first intermediate interconnect trench 1704a may be shallower than the second intermediate interconnect trench 1704b since the via hole 1602 allows for more etchant to etch the second intermediate interconnect trench 1704b than the first intermediate interconnect trench 1704a.

Figure 18:
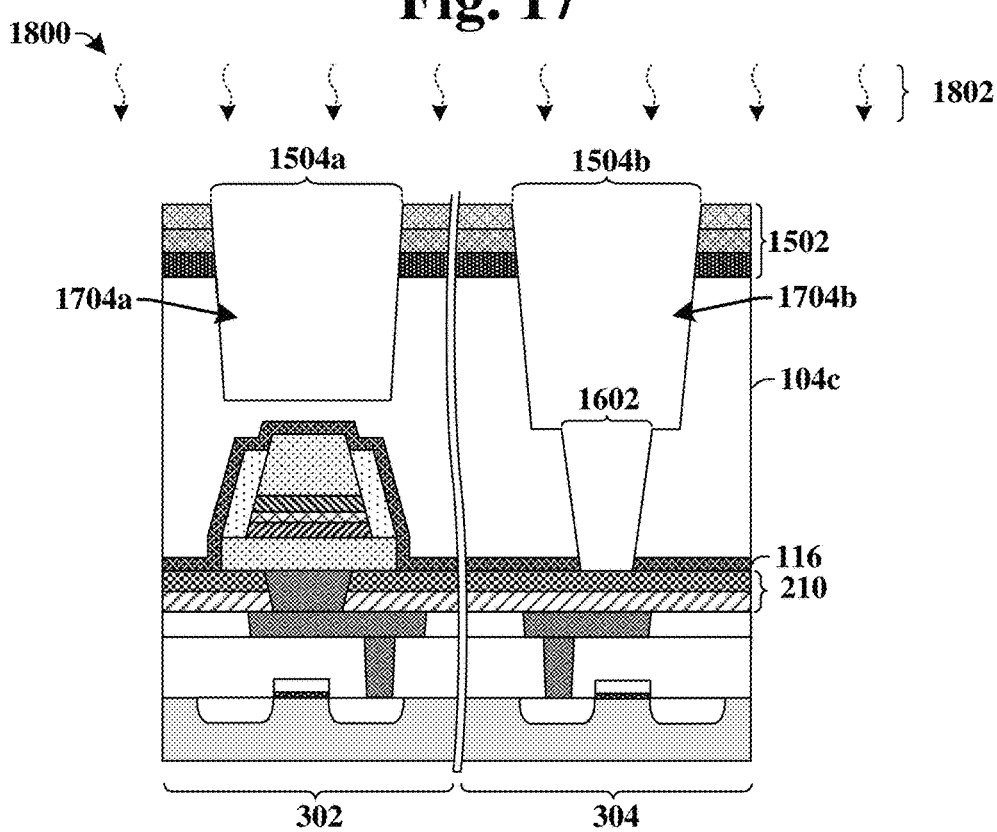

As shown in cross-sectional view 1800 of FIG. 18, a first wet removal process is performed to remove the etch stop layer 116 from below the via hole 1602. In some embodiments, the first wet removal process utilizes a first wet cleaning chemical or etchant 1802 that has a high selectivity between the etch stop layer 116 and the first upper ILD layer 104c. For example, the first wet cleaning chemical or etchant 1802 may remove the etch stop layer 116 more than 10 times faster than the first upper ILD layer 104c. In various embodiments, the first wet cleaning chemical or etchant 1802 may comprise a copper corrosion liquid, an amine and/or a fluoride based mixture (e.g., such as ST250), hydrofluoric acid, or the like. In some embodiments (not shown), the first wet cleaning chemical or etchant 1802 may both vertically and laterally remove the etch stop layer 116 so that the etch stop layer 116 is laterally set back from a sidewall of the first upper ILD layer 104c (e.g., as shown in FIG. 3).

Figure 19:
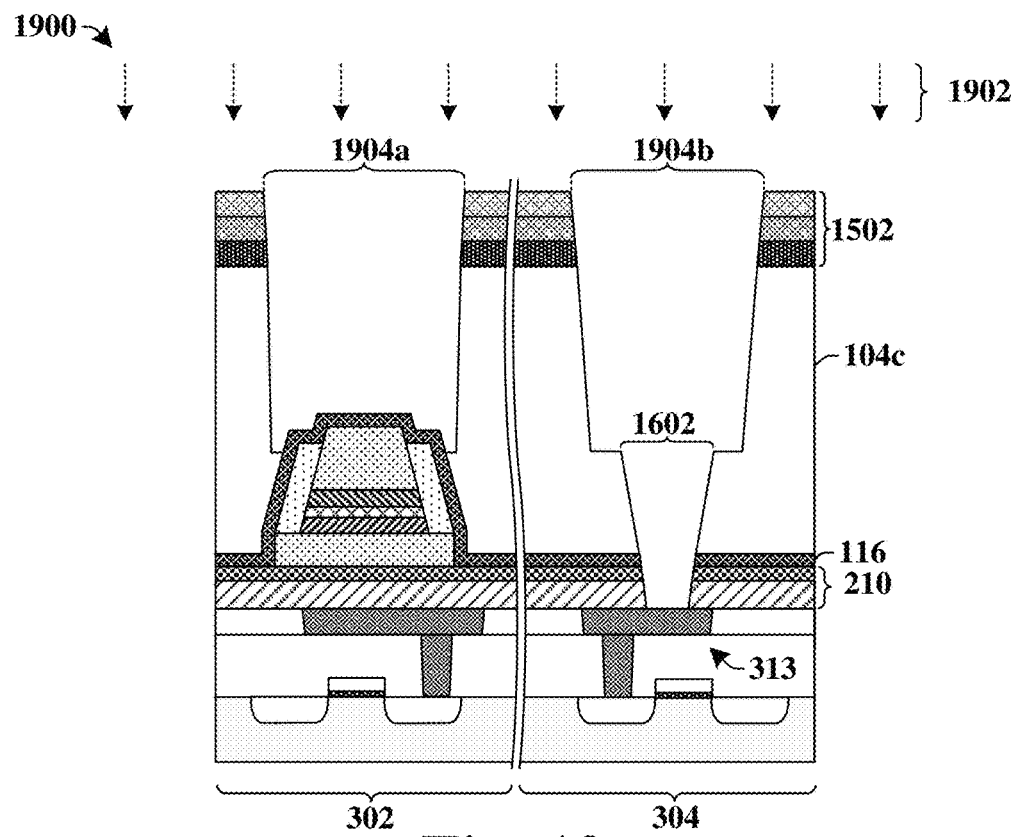

As shown in cross-sectional view 1900 of FIG. 19, a fifth patterning process is performed. The fifth patterning process increases a depth of the first intermediate interconnect trench (1704a of FIG. 18) to form a first interconnect trench 1904a exposing an upper surface of the etch stop layer 116 within the embedded memory region 302. The fifth patterning process also increases a depth of the second intermediate interconnect trench (1704b of FIG. 18) to form a second interconnect trench 1904b. In some embodiments, the fifth patterning process may cause a first interconnect trench 1904a to extend below a top of the memory device 108, so as to expose the etch stop layer 116 along an upper surface and sidewalls of the memory device 108. In some embodiments, the fifth patterning process selectively exposes the first upper ILD layer 104c to a fifth etchant 1902 according to the first opening 1504a and the second opening 1504b of the hard mask structure 1502. In some embodiments, the fifth etchant 1902 may comprise a dry etchant (e.g., having a chlorine based etching chemistry, a fluorine based etching chemistry, or the like). In some embodiments (not shown), the fifth patterning process may etch through both the first upper ILD layer 104c and an upper insulating structure (e.g., upper insulating structure 402 of FIG. 4).

Figure 20:
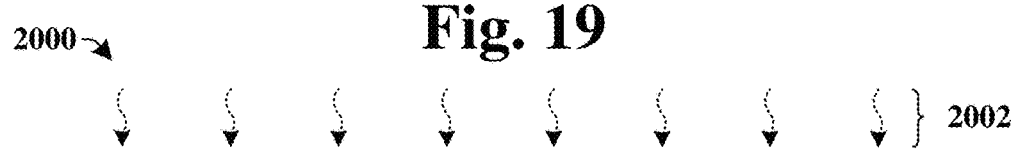

As shown in cross-sectional view 2000 of FIG. 20, a second wet removal process is performed to remove the etch stop layer 116 within the embedded memory region 302. In some embodiments, the second wet removal process utilizes a second wet cleaning chemical or etchant 2002 that has a high selectivity between the etch stop layer 116 and the first upper ILD layer 104c. For example, the second wet cleaning chemical or etchant 2002 may remove the etch stop layer 116 more than 10 times faster than the first upper ILD layer 104c. In various embodiments, the second wet cleaning chemical or etchant 2002 may comprise a copper corrosion liquid, an amine and/or a fluoride based mixture (e.g., such as ST250), hydrofluoric acid, or the like. In some embodiments (not shown), the second wet cleaning chemical or etchant 2002 may further laterally remove the etch stop layer 116 so that the etch stop layer 116 is laterally set back from a sidewall of the lower insulating structure 210 and/or the first upper ILD layer 104c (e.g., as shown in FIG. 3).

Figure 21:
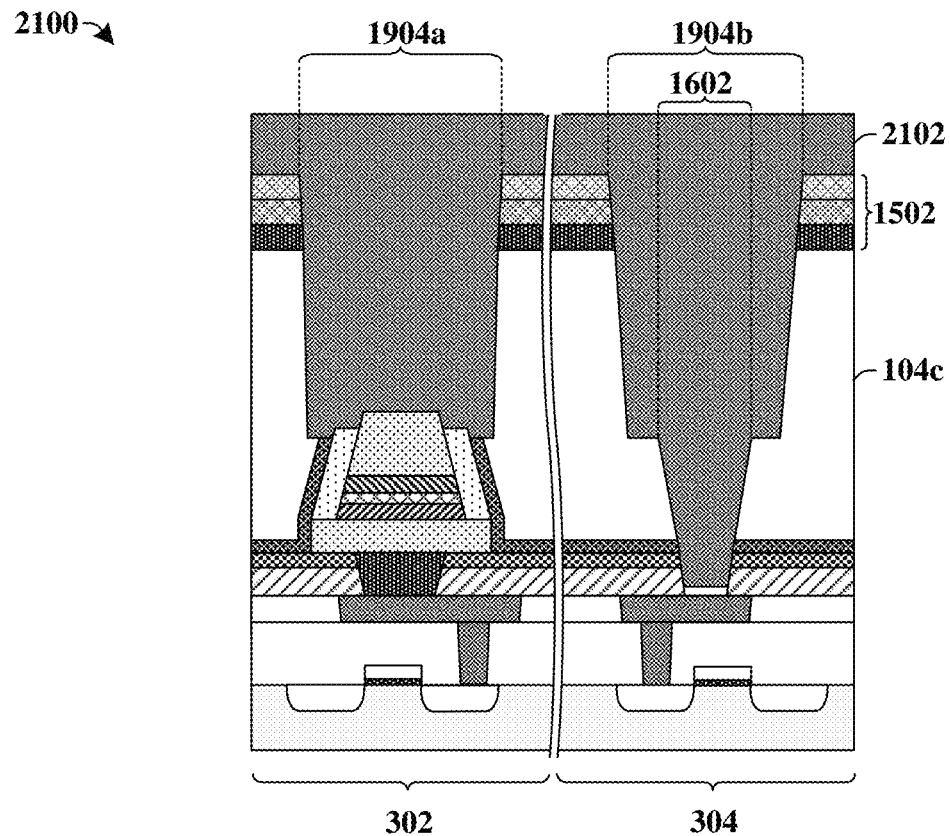

As shown in cross-sectional view 2100 of FIG. 21, a conductive material 2102 is deposited within the first interconnect trench 1904a, the second interconnect trench 1904b, and the via hole 1602. In some embodiments, the conductive material 2102 may comprise aluminum, copper, tungsten, or the like.

Figure 22:
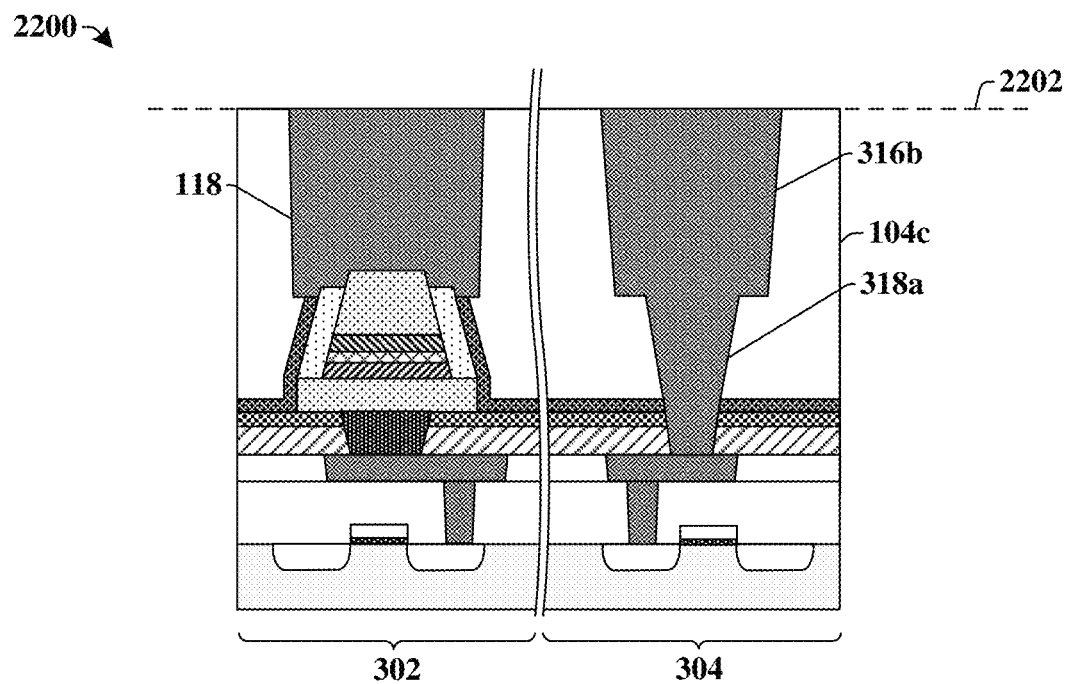

As shown in cross-sectional view 2200 of FIG. 22, a second planarization process (e.g., a CMP process) is performed on the first upper ILD layer 104c. The second planarization process is performed along line 2202 to remove the conductive material 2102 from over the first upper ILD layer 104c. In some embodiments, the second planarization process may comprise a chemical mechanical polishing (CMP) process.

Figure 23:
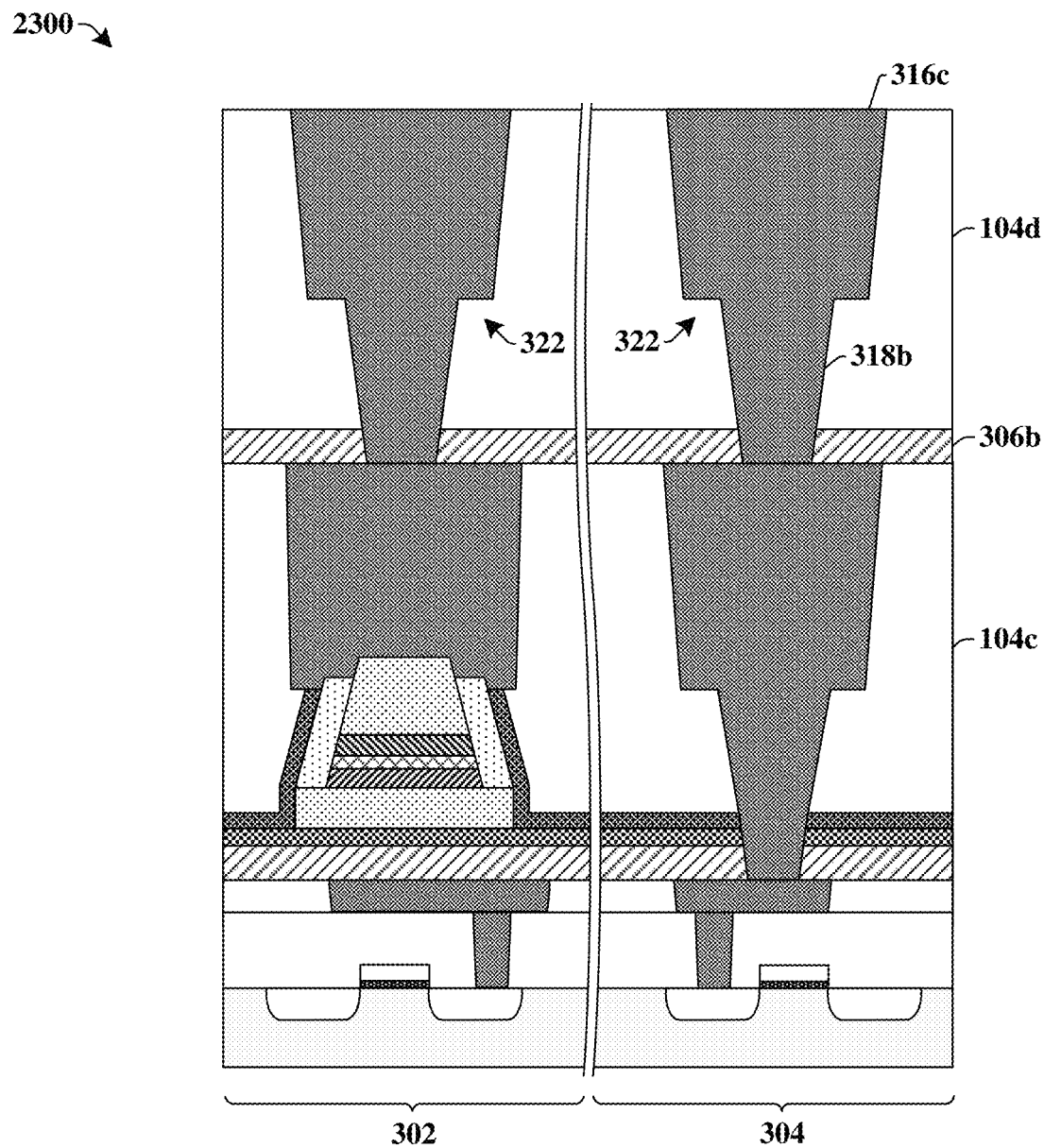

As shown in cross-sectional view 2300 of FIG. 23, one or more additional interconnect layers 322 are formed within a second upper ILD layer 104d formed over the first upper ILD layer 104c. In some embodiments, the one or more additional interconnect layers 322 may be respectively formed using a damascene process (e.g., a single damascene process or a dual damascene process). The damascene process is performed by forming the second upper ILD layer 104d over the first upper ILD layer 104c, etching the second upper ILD layer 104d to form a via hole and/or a trench, and filling the via hole and/or the trench with a conductive material. In some embodiments, the second upper ILD layer 104d may be deposited by a physical vapor deposition technique (e.g., PVD, CVD, PE-CVD, ALD, etc.) and the conductive material (e.g., tungsten, copper, aluminum, or the like) may be formed using a deposition process and/or a plating process (e.g., electroplating, electro-less plating, etc.).

Figure 24:
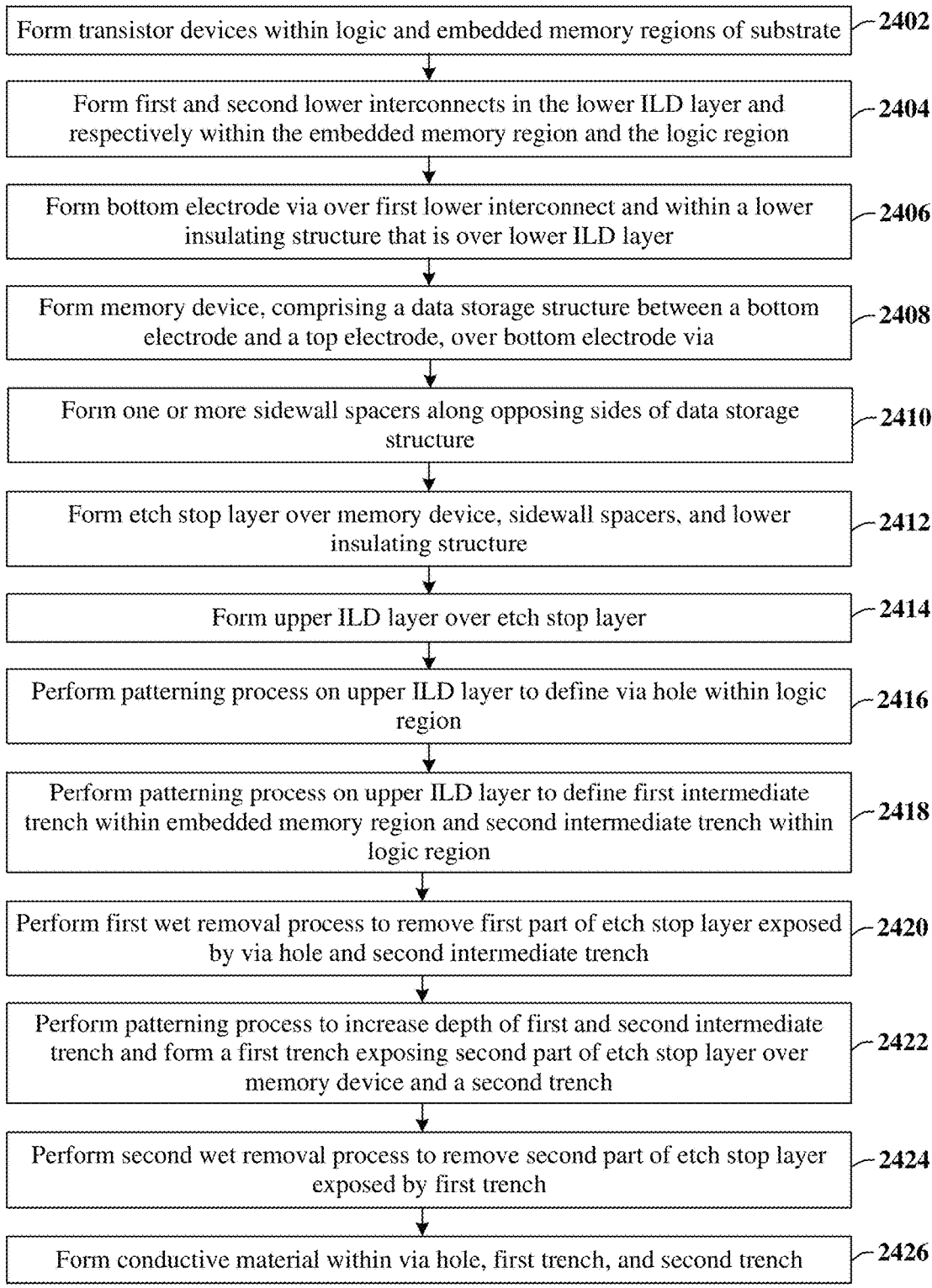
FIG. 24 illustrates a flow diagram of some embodiments of a method of forming an integrated chip having an etch stop layer configured to improve a process used to form a memory device.

FIG. 24 illustrates a flow diagram of some embodiments of a method 2400 of forming an integrated chip having an etch stop layer configured to improve formation of an MTJ device.

While method 2400 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2402, transistor devices are formed within a logic region and an embedded memory region of a substrate. FIG. 6 illustrates a cross-sectional view 600 of some embodiments corresponding to act 2402.

At 2404, first and second lower interconnects are formed within a lower inter-level dielectric (ILD) layer over the substrate. The first lower interconnect is formed within the embedded memory region and the second lower interconnect is formed within the logic region. FIG. 6 illustrates a cross-sectional view 600 of some embodiments corresponding to act 2404.

At 2406, a bottom electrode via is formed over the first lower interconnect and within a lower insulating structure that is over the lower ILD layer. FIGS. 7-8 illustrate cross-sectional views 700-800 of some embodiments corresponding to act 2406.

At 2408, a memory device is formed over the bottom electrode via. The memory device comprises a data storage structure arranged between a bottom electrode and a top electrode. FIGS. 9-11 illustrate cross-sectional views 900-1100 of some embodiments corresponding to act 2408.

At 2410, one or more sidewall spacers are formed along opposing sides of the data storage structure. FIG. 11 illustrates a cross-sectional view 1100 of some embodiments corresponding to act 2410.

At 2412, an etch stop layer is formed over the memory device, the sidewall spacers, and the lower insulating structure. FIG. 12 illustrates a cross-sectional view 1200 of some embodiments corresponding to act 2412.

At 2414, an upper ILD layer is formed over the etch stop layer. FIGS. 13-14 illustrate cross-sectional views 1300-1400 of some embodiments corresponding to act 2414.

At 2416, a patterning process is performed on the upper ILD layer to define a via hole within the logic region. FIGS. 15-16 illustrate cross-sectional views 1500-1600 of some embodiments corresponding to act 2416.

At 2418, a patterning process is performed on the upper ILD layer to define a first intermediate trench within the logic region and a second intermediate trench within the embedded memory region. FIG. 17 illustrates a cross-sectional view 1700 of some embodiments corresponding to act 2418.

At 2420, a first wet removal process is performed to remove a first part of the etch stop layer exposed by the via hole and the second intermediate trench. Removing the first part of the etch stop layer exposes the lower insulating structure directly over the second lower interconnect structure. FIG. 18 illustrates a cross-sectional view 1800 of some embodiments corresponding to act 2420.

At 2422, a patterning process is performed to increase depths of the first and second intermediate trenches to form first and second trenches. The patterning process also removes the exposed part of the lower insulating structure, so as to form an opening that exposes the second lower interconnect structure. The first trench exposes a second part of the etch stop layer over the memory device. However, because the etch stop layer is covering the memory device, the patterning process is prevented from damaging the memory device. FIG. 19 illustrates a cross-sectional view 1900 of some embodiments corresponding to act 2422.

At 2424, a second wet removal process is performed to remove the second part of the etch stop layer. FIG. 20 illustrates a cross-sectional view 2000 of some embodiments corresponding to act 2424.

At 2426, a conductive material is formed within the via hole, the first trench, and the second trench. FIG. 21 illustrates a cross-sectional view 2100 of some embodiments corresponding to act 2426.

Accordingly, in some embodiments, the present disclosure relates to an integrated chip having an etch stop layer that is configured to reduce damage to a memory device. The etch stop layer also improves a process window and/or reduces a cost of a process used to form the memory device.

In some embodiments, the present disclosure relates to a method of forming an integrated chip. The method includes forming a memory device over a substrate; forming an etch stop layer over the memory device; forming an inter-level dielectric (ILD) layer over the etch stop layer and laterally surrounding the memory device; performing one or more patterning process to define a first trench extending from a top of the ILD layer to expose an upper surface of the etch stop layer; performing a removal process to remove an exposed part of the etch stop layer; and forming a conductive material within the first trench after performing the removal process. In some embodiments, the removal process includes a wet cleaning process or a wet etching process. In some embodiments, performing one or more patterning processes includes performing a first patterning process on the ILD layer to form a first intermediate trench over the memory device, the first intermediate trench separated from the etch stop layer by the ILD layer; and performing a second patterning process on the ILD layer to increase a depth of the first trench and to define the first trench. In some embodiments, the method further includes forming a via hole and an overlying second trench within the ILD layer, the second trench and the via hole exposing a second part of the etch stop layer prior to performing the second patterning process. In some embodiments, the via hole exposes a second upper surface of the etch stop layer that is laterally outside of the memory device. In some embodiments, the method further includes performing a second removal process to remove the second part of the etch stop layer prior to performing the removal process. In some embodiments, the second removal process includes a wet cleaning process or a wet etching process. In some embodiments, the method further includes forming an upper insulating structure along the upper surface and along sidewalls of the etch stop layer; and forming the ILD layer over the upper insulating structure, the one or more patterning processes etch through the upper insulating structure to expose the upper surface of the etch stop layer. In some embodiments, the etch stop layer has a first upper surface along a first side of the memory device and a second upper surface along a second side of the memory device opposing the first side after performing the removal process; and the first upper surface and the second upper surface are at different heights over the substrate.

In other embodiments, the present disclosure relates to a method of forming an integrated chip. The method includes forming a memory device over one or more lower inter-level dielectric (ILD) layers on a substrate, the memory device having a data storage structure disposed between a bottom electrode and a top electrode; forming an etch stop layer over the top electrode; forming an upper ILD layer over the etch stop layer and laterally surrounding the memory device; forming a recess within the upper ILD layer, the recess extending from a top of the upper ILD layer to the etch stop layer; removing an exposed part of the etch stop layer; and forming an upper interconnect wire within the recess. In some embodiments, the upper ILD layer has a horizontally extending surface that is directly below the upper interconnect wire and laterally outside of a top surface of the memory device; and the etch stop layer has a top surface that is recessed below the horizontally extending surface. In some embodiments, the method further includes forming a lower insulating structure over the one or more lower ILD layers; forming a bottom electrode via within the lower insulating structure, the bottom electrode formed over the bottom electrode via; and forming a via hole defined by sidewalls of the upper ILD layer, the etch stop layer, and the lower insulating structure. In some embodiments, the sidewalls of the etch stop layer defining the via hole are laterally set back from sidewalls of the lower insulating structure defining the via hole by a non-zero distance. In some embodiments, the etch stop layer includes a metal oxide or a metal nitride. In some embodiments, a first etchant is used to define the recess within the upper ILD layer and a wet cleaning chemical is used to remove the etch stop layer, the first etchant being different than the wet cleaning chemical.

In yet other embodiments, the present disclosure relates to an integrated chip. The integrated chip includes a memory device disposed over a lower interconnect within one or more lower inter-level dielectric (ILD) layers over a substrate; an upper ILD layer laterally surrounding the memory device; an etch stop layer separating the memory device and the one or more lower ILD layers from the one or more upper ILD layers, the etch stop layer having an upper surface that is below a top of the memory device; and an upper interconnect wire contacting sidewalls of the memory device above the etch stop layer. In some embodiments, the integrated chip further includes a lower insulating structure disposed over the one or more lower ILD layers; a bottom electrode via extending through the lower insulating structure between the lower interconnect and the memory device;

and an upper insulating structure separating the lower insulating structure from the upper ILD layer. In some embodiments, the upper insulating structure has an uppermost surface that is vertically offset from an uppermost surface of the etch stop layer by a non-zero distance. In some embodiments, the upper ILD layer has a horizontally extending surface that is directly below the upper interconnect wire and laterally outside of the memory device; and the etch stop layer has an uppermost surface that is recessed below the horizontally extending surface. In some embodiments, the etch stop layer has a first upper surface along a first side of the memory device and a second upper surface along a second side of the memory device opposing the first side, the first upper surface and the second upper surface being disposed at different heights over the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip, comprising:
   forming a memory device over a substrate;
   forming an etch stop layer over the memory device;
   forming an inter-level dielectric (ILD) layer over the etch stop layer and laterally surrounding the memory device;
   performing a patterning process to define a first trench that exposes an upper surface and a sidewall of the etch stop layer;
   performing a removal process, after performing the patterning process, to remove an exposed part of the etch stop layer; and
   forming a conductive material within the first trench after performing the removal process.

2. The method of claim 1, wherein the removal process comprises a wet cleaning process or a wet etching process.

3. The method of claim 1, further comprising:
   performing a first patterning process on the ILD layer to form a first intermediate trench over the memory device, wherein the first intermediate trench is separated from the etch stop layer by the ILD layer; and
   performing the patterning process on the ILD layer to increase a depth of the first trench and to define the first trench.

4. The method of claim 3, further comprising:
   forming a via hole and an overlying second trench within the ILD layer, wherein the second trench and the via hole expose a second part of the etch stop layer prior to performing the second patterning process.

5. The method of claim 4, wherein the via hole exposes a second upper surface of the etch stop layer that is laterally outside of the memory device.

6. The method of claim 4, further comprising:
   performing a second removal process to remove the second part of the etch stop layer prior to performing the removal process.

7. The method of claim 6, wherein the second removal process comprises a wet cleaning process or a wet etching process.

8. The method of claim 1, wherein the sidewall and the upper surface of the etch stop layer define the first trench.

9. The method of claim 1,
   wherein the etch stop layer has a first upper surface along a first side of the memory device and a second upper surface along a second side of the memory device opposing the first side after performing the removal process; and
   wherein the first upper surface and the second upper surface are at different heights over the substrate.

10. A method of forming an integrated chip, comprising:
    forming a memory device over one or more lower inter-level dielectric (ILD) layers on a substrate, wherein the memory device comprises a data storage structure disposed between a bottom electrode and a top electrode;
    forming an etch stop layer over the top electrode, wherein the etch stop layer comprises a metal oxide or a metal nitride;
    forming an upper ILD layer over the etch stop layer and laterally surrounding the memory device;
    forming a recess within the upper ILD layer, wherein the recess extends from a top of the upper ILD layer to the etch stop layer;
    removing an exposed part of the etch stop layer; and
    forming an upper interconnect wire within the recess.

11. The method of claim 10,
    wherein the upper ILD layer has a horizontally extending surface that is directly below the upper interconnect wire and laterally outside of a top surface of the memory device; and
    wherein the etch stop layer has a top surface that is recessed below the horizontally extending surface.

12. The method of claim 10, further comprising:
    forming a lower insulating structure over the one or more lower ILD layers;
    forming a bottom electrode via within the lower insulating structure, wherein the bottom electrode is formed over the bottom electrode via; and
    forming a via hole defined by sidewalls of the upper ILD layer, the etch stop layer, and the lower insulating structure.

13. The method of claim 12, wherein the sidewalls of the etch stop layer defining the via hole are laterally set back from the sidewalls of the lower insulating structure defining the via hole by a non-zero distance.

14. The method of claim 10, wherein a first etchant is used to define the recess within the upper ILD layer and a wet cleaning chemical is used to remove the etch stop layer, the first etchant different than the wet cleaning chemical.

15. An integrated chip, comprising:
    a memory device disposed over a lower interconnect within one or more lower inter-level dielectric (ILD) layers over a substrate;
    one or more sidewall spacers arranged along opposing sides of the memory device;
    an upper ILD layer laterally surrounding the memory device;
    an etch stop layer disposed on a sidewall of the one or more sidewall spacers and over an upper surface of the one or more lower ILD layers, wherein the etch stop layer has a topmost surface that is vertically below both a top of the memory device and a topmost surface of the one or more sidewall spacers; and an upper interconnect wire contacting sidewalls of the memory device above the etch stop layer.

16. The memory device of claim 15, further comprising:
a lower insulating structure disposed over the one or more lower ILD layers;
a bottom electrode via extending through the lower insulating structure between the lower interconnect and the memory device; and
an upper insulating structure separating the lower insulating structure from the upper ILD layer.

17. The memory device of claim 16, wherein the upper interconnect wire has a first lower surface resting on the topmost surface of the etch stop layer and a second lower surface resting on the topmost surface of the one or more sidewall spacers, the second lower surface vertically above the first lower surface.

18. The memory device of claim 15,
wherein the upper ILD layer has a horizontally extending surface that is directly below the upper interconnect wire and laterally outside of the memory device; and
wherein the topmost surface of the etch stop layer is recessed a non-zero distance below the horizontally extending surface.

19. The memory device of claim 15, wherein the etch stop layer has a first upper surface along a first side of the memory device and a second upper surface along a second side of the memory device opposing the first side, the first upper surface and the second upper surface being disposed at different heights over the substrate.

20. The memory device of claim 15, wherein the etch stop layer comprises a metal oxide or a metal nitride.

* * * * *